US006436193B1

(12) United States Patent
Kasai et al.

(10) Patent No.: US 6,436,193 B1
(45) Date of Patent: Aug. 20, 2002

(54) GAS PROCESSING APPARATUS BAFFLE MEMBER, AND GAS PROCESSING METHOD

(75) Inventors: Shigeru Kasai, Higashiyatsushiro; Teruo Iwata, Nirasaki; Taro Komiya, Takarazuka; Tomihiro Yonenaga, Kitakoma-gun, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/534,342

(22) Filed: Mar. 24, 2000

(30) Foreign Application Priority Data

Apr. 7, 1999 (JP) .......................................... 11-100341

(51) Int. Cl.[7] ............................................... C23C 16/00

(52) U.S. Cl. .................................... 118/715; 427/248.1

(58) Field of Search ........................ 118/715; 427/248.1

(56) References Cited

U.S. PATENT DOCUMENTS 4,792,378 A * 12/1988 Rose et al. ................. 438/706
4,854,263 A 8/1989 Chang et al.
4,993,358 A * 2/1991 Mahawili .................... 118/715
5,494,713 A * 2/1996 Ootuki ....................... 427/579
5,595,602 A * 1/1997 Harlan ....................... 118/715
5,616,208 A * 4/1997 Lee ........................... 156/345
5,624,498 A * 4/1997 Lee et al. .................. 118/715
5,766,364 A * 6/1998 Ishida et al. ................ 118/725
5,972,114 A * 10/1999 Yonenaga et al. .......... 118/715
6,086,677 A * 7/2000 Umotoy et al. ............. 118/715
6,106,663 A * 8/2000 Kuthi et al. ................ 156/345

FOREIGN PATENT DOCUMENTS

JP 1-139771 6/1989

* cited by examiner

*Primary Examiner*—Jeffrie R. Lund
(74) *Attorney, Agent, or Firm*—Pillsbury Winthrop LLP

(57) ABSTRACT

A gas processing apparatus is disclosed, that comprises a processing chamber that is airtightly structured, a gas delivery pipe connected to the processing chamber, a gas supply source for supplying gas to the processing chamber through the gas delivery pipe, a holding table for holding a workpiece loaded to the processing chamber, a shower member disposed at a gas outlet of the gas delivery pipe connected to the processing chamber, a spray plate structured as a partition wall of the shower member that faces the holding plate, the spray plate having a plurality of spray holes, and a baffle member disposed between the spray plate in the shower member and the gas outlet and having a plurality of through-holes formed perpendicular to the surface of the baffle member, wherein each of the through-holes of the baffle member has a first opening portion and a second opening portion facing the gas outlet, the second opening portion facing the spray plate, the opening area of the second opening portion being larger than the opening portion of the first opening portion. Thus, a gas processing apparatus and a gas processing method that allow gas to be uniformly supplied to the entire surface of a workpiece are provided. In addition, a baffle member for use with the gas processing apparatus and the gas processing method is provided.

13 Claims, 14 Drawing Sheets

GAS PROCESSING APPARATUS BAFFLE MEMBER, AND GAS PROCESSING METHOD

BACKGROUND OF THE INVENTION

1. Field of the Invention

The present invention relates to a gas processing technology, in particular, to a gas processing apparatus, a baffle member, and a gas processing method for use in fabrication of semiconductor devices.

2. Description of the Related Art

When semiconductor devices are fabricated, a gas processing apparatus that supplies various types of gas to a processing chamber and performs a predetermined process for a workpiece is used.

As an example of such a gas processing apparatus, a CVD (Chemical Vapor Deposition) apparatus is known.

In the CVD apparatus, various types of gas as row materials are supplied to a workpiece such as a wafer disposed in a processing chamber. Using thermal energy of the wafer, plasma excitation, and so forth, gas as a chemically active reaction seed causes a thin film to be formed on the wafer. Thus, to equally form a thin film on the entier surface of the wafer using such an apparatus, it is necessary to uniformly supply the gas to the entire surface of the wafer.

To uniformly supply a gas to the entire surface of the wafer, in the CVD apparatus, a gas processing apparatus that has a gas supplying means and a shower head is used. The gas supplying means is disposed at a position where it faces the processing surface of the wafer. The shower head is structured as shown in FIG. 13. The shower head supplies the gas to the wafer.

FIG. 13 is a sectional view showing the structure in the vicinity of the shower head of the gas processing apparatus.

As shown in FIG. 13, the shower head 41 is disposed so that the bottom surface as the spray side of the shower head 41 faces a wafer 42. A gas delivery pipe 43 is connected to an upper portion of the shower head 41. The gas delivery pipe 43 causes the gas to be delivered to the interior of the shower head 41. A spray plate 44 is disposed at a lower portion of the shower head 41. The spray plate 44 composes a bottom side partition wall of the shower head 41. Many spray holes 45 are formed as gas spray holes on the spray plate 44. The gas delivered from the gas delivery pipe 43 to the interior of the shower head 41 is supplied to the surface of the wafer 42 through the spray holes 45.

A shower head that has a plate with many small through-holes that cause the difference between the gas flow amount of the gas that sprays from the center of the shower head and the gas flow amount of the gas that sprays from the periphery thereof to decrease has been proposed. The plate is termed baffle plate. An example of the structure of the baffle plate is shown in FIG. 14.

FIG. 14 is a sectional view showing the structure in the vicinity of a shower head of a gas processing apparatus having a baffle plate.

As shown in FIG. 14, a baffle plate 47 having many through-holes is disposed between a spray plate 44 of a shower head 41 and a connecting portion of a gas delivery pipe 43. With the baffle plate 47, gas delivered from the gas delivery pipe 43 is temporarily stored in a baffle space 48 on the upstream side of the baffle plate 47.

Thus, the irregularity of dynamic pressure of the gas delivered from the gas delivery pipe 43 decreases. Consequently, the flow amount of the gas that flows in the through-holes 46 becomes almost equal. The resultant gas is supplied to a shower pre-chamber 49 on the downstream side of the baffle plate 47.

Thus, the irregularity of the pressure in the shower pre-chamber 49 decreases. Consequently, the flow amount of the gas sprayed from the spray plate becomes constant. Thus, the gas is uniformly supplied to the entire surface of the wafer 42.

To cause the flow amount of the gas that flows in the through-holes 46 to be equal, it is effective to decrease the hole diameters of the through-holes 46 so as to increase the flow pressure loss of the through-holes 46. When the hold diameters of the through-holes 46 are decreased, the pressure in the baffle space 48 rises and thereby the irregularity of the pressure due to the dynamic pressure of the gas decreases. In addition, since the difference between the pressure of the upper portion and the pressure of the lower portion (the pressure in the baffle space 48 and the pressure in the shower pre-chamber 49) of the baffle plate 47 becomes large. Thus, the pressure at each position of the baffle plate 47 becomes almost equal. As a result, the flow amount of the gas that flows in the through-holes 46 becomes almost equal.

However, due to the restriction of the machining accuracy, the cost restriction, the limitation of the pressure on the upstream side of the baffle plate 47, and so forth, the hole diameters of the through-holes 46 cannot be satisfactorily decreased. Thus, the gas cannot be uniformly supplied to the entire surface of the wafer 42.

In addition, as the hole diameters of the through-holes 46 decrease, the flow rate of the gas increases. Thus, the dynamic pressure of the gas that flow from the through-holes 46 increases. Thus, the backing pressure of the spray holes 45 in the vicinity of the lower portion of the through-holes 46 locally rises. Consequently, the flow amounts of the spray holes 45 become irregular.

In a related art reference disclosed as Japanese Patent Laid-Open Publication No. 1-139771, spray holes are formed in such a manner that the hole diameters on the gas outlet side are larger than those on the gas inlet side. Thus, since gas that flows in the spray holes expands and diffuses on the outlet side, the gas uniformly sprays.

However, according to such a related art reference, gas is uniformly sprayed from each spray hole. In other words, the flow amount of gas sprayed from spray holes at the center portion of the spray plate is different from that at the peripheral portion of the spray plate. Thus, according to the related art reference, gas cannot be uniformly supplied to the entire surface of the wafer.

SUMMARY OF THE INVENTION

The present invention is made to solve the above-described problems. In other words, an object of the present invention is to provide a gas processing apparatus and a gas processing method that allow gas to be uniformly supplied to the entire surface of a workpiece. Another object of the present invention is to provide a baffle member for use with the gas processing apparatus and the gas processing method.

A first aspect of the present invention is a gas processing apparatus, comprising a processing chamber that is airtightly structured, a gas delivery pipe connected to the processing chamber, a gas supply source for supplying gas to the processing chamber through the gas delivery pipe, a holding table for holding a workpiece loaded to the processing chamber, a shower member disposed at a gas outlet of the gas delivery pipe connected to the processing chamber, a spray plate structured as a partition wall of the shower member that faces the holding plate, the spray plate having a plurality of spray holes, and a baffle member disposed between the spray plate in the shower member and the gas outlet and having a plurality of through-holes formed perpendicular to the surface of the baffle member, wherein each of the through-holes of the baffle member has a first opening portion and a second opening portion facing the gas outlet, the second opening portion facing the spray plate, the opening area of the second opening portion being larger than the opening portion of the first opening portion.

In the gas processing apparatus, the through-holes are formed so that their axes are perpendicular to the front surface of the baffle member.

For example, each of the through-holes is a two-diameter hole. A large diameter hole portion and a small diameter hole portion of each through-hole are connected on one straight line so that the center of the bottom of the large diameter hole portion matches the center of the bottom of the small diameter hole portion (hereinafter, the straight line is referred to as "same axis"). When each through-hole has a convex section, the same axis is perpendicular to the front surface of the baffle member.

When each through-hole has two opening portions that are a small opening portion and a small opening portion and the inner wall of each through-hole is tapered as a side surface of a circular cone that connects the two opening portions, the axis of the circular cone is perpendicular to the front surface of the baffle member.

The shape of each through-hole is not limited as long as the center of the first opening portion and the center of the second opening portion are on the normal of the front surface of the baffle member and the opening area of the second opening portion is larger than the opening area of the first opening portion. For example, the shape of each through-hole may be a circle, an ellipse, or a polygon. From view points of easy fabrication and similarity in the parallel direction with the surface of the baffle plate, the shapes of the first opening portion and the second opening portion are preferably circles.

The inner wall surface of each through-hole that connects the first opening portion and the second opening portion may be formed in the above-described convex shape as a two-diameter hole or tapered. Alternatively, the inner wall surface may be formed in a semi-sphere shape. However, from view points of easy machinability and reduction of flow rate of gas flow, it is preferred to taper the inner wall surface.

A typical example of the baffle member according to the present invention is a baffle plate.

The shower member according to the present invention is a shower head. Alternatively, the shower member may be structured by separating a chamber into a plurality of chambers with partition plates and forming a plurality of small holes in the partition plates.

According to the gas processing apparatus of the present invention, since the opening area of the first opening portion of each of the through-holes is smaller than the opening area of the second opening portion of each of the through-holes, when gas delivered from the gas delivery pipe to the shower member flows in the first opening portions of the through-holes, since the flow resistance is large, the backing pressure of the baffle member becomes large.

When the backing pressure of the baffle member becomes large, the irregularity of the dynamic pressure of the gas due to the spray flow from the gas outlet of the gas delivery pipe decreases. Thus, the irregularity of the backing pressure of the baffle member decreases. Consequently, the flow amount of the gas that flows in the through-holes becomes equal.

When the irregularity of the dynamic pressure of the gas that flows in the first opening portion decreases due to a large pressure loss of the gas that flows in the first opening portion, the gas sprays from the first opening portion to the second opening portion that spreads from the first opening portion. The gas that flows in the second opening portion collides with the inner surface thereof and thereby decelerates. In addition, the second opening portion causes the flow rate of the gas to be uniform. Thus, the flow rate of the gas that flows from the second opening portion decelerates. In particular, when the spread angle of the second opening portion against the first opening portion is in the range from 0.5 to 45 degrees, preferably in the range from 1 to 30 degrees, the flow rate of the gas that flows from the second opening portion effectively and largely decelerates in comparison with the flow rate of the first opening portion.

When the opening area of the second opening portion is two times the opening area of the first opening portion, preferably four times that thereof, the average flow rate of the gas decelerates two times larger than that of which the second opening portion, preferably four times larger than that thereof. Generally, the dynamic pressure is proportional to the square of the flow rate. Thus, the dynamic pressure of the gas that flows from the second opening portion is four times smaller than that of which the second opening portion spreads from the first opening portion, preferably 16 times smaller than that thereof. Thus, the uniformity of the backing pressure of the spray plate improves. Consequently, the gas is uniformly supplied to the entire surface of the workpiece (wafer).

A second aspect of the present invention is a gas processing apparatus, comprising a processing chamber that is airtightly structured, a gas delivery pipe connected to the processing chamber, a gas supply source for supplying gas to the processing chamber through the gas delivery pipe, a holding table for holding a workpiece loaded to the processing chamber, a shower member disposed at a gas outlet of the gas delivery pipe connected to the processing chamber, and a baffle member disposed between the spray plate in the shower member and the gas outlet, wherein the gas outlet of the gas delivery pipe spreads toward the shower member.

According to the second aspect of the present invention, the gas outlet is an edge portion of the gas delivery portion disposed in the processing chamber. The gas is supplied from the gas supply source to the processing chamber through the gas outlet.

According to the gas processing apparatus of the second aspect of the present invention, the gas delivered to the gas outlet of the gas delivery pipe collides with the inner surface that spreads and thereby decelerates. In addition, the inner surface that spreads causes the flow rate of the gas that flows from the gas outlet to be uniform. Thus, the flow rate of the gas that flows from the gas outlet decelerates. When the gas outlet of the gas delivery pipe spreads with a spread angle in the range from 0.5 to 45 degrees, preferably in the range from 1 to 30 degrees, the flow rate of the gas that flows from the gas outlet largely decelerates.

In addition, when the opening area of the gas outlet of the gas delivery pipe is two times or more larger than the opening area of the gas inlet of the gas delivery pipe, preferably four times or more larger than that thereof, the flow rate of the gas that flows from the gas outlet much largely decelerates. Thus, the dynamic pressure of the gas that sprays from the gas outlet becomes small and thereby the backing pressure of the spray plate becomes equal. Thus, the gas is uniformly supplied to the entire surface of the workpiece (wafer).

A third aspect of the present invention is a gas processing apparatus, comprising a processing chamber that is airtightly structured, a gas delivery pipe connected to the processing chamber, a gas supply source for supplying gas to the processing chamber through the gas delivery pipe, a holding table for holding a workpiece loaded to the processing chamber, a shower member disposed at a gas outlet of the gas delivery pipe connected to the processing chamber, and a spray plate structured as a partition wall of the shower member that faces the holding plate, the spray plate having a plurality of spray holes, wherein the opening area of the gas outlet of the gas delivery pipe is two times (or more) larger than the opening area of a non-spread portion of the gas delivery pipe.

According to the third aspect of the present invention, the "non-spread portion of the gas delivery pipe" is a non-tapered portion of the gas delivery pipe. Examples of the "non-spread portion of the gas delivery pipe" are an edge portion that extrudes from the processing chamber and an inlet portion of which the gas is supplied from the gas supply source to the gas delivery pipe.

According to the gas processing apparatus of the third aspect of the present invention, the gas that flows in the gas delivery pipe is delivered to a space (a shower pre-chamber or a buffer chamber) of the shower member through the gas outlet that spreads two times larger than the gas delivery pipe, the flow rate of the gas of the gas outlet is 0.5 times smaller than the flow rate of which the gas outlet of the gas delivery pipe does not spread. Thus, the dynamic pressure of the gas that sprays from the gas outlet of the gas delivery pipe decreases. Consequently, the gas is uniformly supplied to the entire surface of the workpiece (wafer).

A fourth aspect of the present invention is a gas processing method, using a gas processing apparatus having a processing chamber that is airtightly structured, a gas delivery pipe connected to the processing chamber, a gas supply source for supplying gas to the processing chamber through the gas delivery pipe, a holding table for holding a workpiece loaded to the processing chamber, a shower member disposed at a gas outlet of the gas delivery pipe connected to the processing chamber, a spray plate structured as a partition wall of the shower member that faces the holding plate, the spray plate having a plurality of spray holes, and a baffle member disposed between the spray plate in the shower member and the gas outlet and having a plurality of through-holes formed perpendicular to the surface of the baffle member, wherein each of the through-holes of the baffle member has a first opening portion and a second opening portion facing the gas outlet, the second opening portion facing the spray plate, the opening area of the second opening portion being larger than the opening portion of the first opening portion, the gas processing method comprising the step of spraying the gas to the workpiece from the gas supply source through the delivery pipe, the through-holes, and the spray holes, wherein the gas delivered to the first opening portion of each of the through-holes is sprayed to the second opening portion so that the through-holes decelerate the flow rate of the gas.

A fifth aspect of the present invention is a gas processing method, using a gas processing apparatus having a processing chamber that is airtightly structured, a gas delivery pipe connected to the processing chamber, a gas supply source for supplying gas to the processing chamber through the gas delivery pipe, a holding table for holding a workpiece loaded to the processing chamber, a shower member disposed at a gas outlet of the gas delivery pipe connected to the processing chamber, a spray plate structured as a partition wall of the shower member that faces the holding plate, the spray plate having a plurality of spray holes, and a baffle member disposed between the spray plate in the shower member and the gas outlet and having a plurality of through-holes formed perpendicular to the surface of the baffle member, wherein each of the through-holes of the baffle member has a first opening portion and a second opening portion facing the gas outlet, the second opening portion facing the spray plate, the opening area of the second opening portion being larger than the opening portion of the first opening portion, the gas processing method comprising the step of spraying the gas to the workpiece from the gas supply source through the delivery pipe and the spray holes, wherein the gas supplied from the gas supply source is sprayed to the gas outlet of the gas delivery pipe so as to decelerate the flow rate of the gas.

A sixth aspect of the present invention is a baffle member having a plurality of through-holes for partitioning a space of which gas flows in one direction into a first chamber on the upstream side in the gas flow direction and a second chamber on the downstream side in the gas flow direction and for causing the gas to flow between the first chamber and the second chamber, wherein each of the through-holes of the baffle member has a first opening portion and a second opening portion, the first opening portion facing the first chamber, the second opening portion facing the second chamber, the opening area of the second opening portion being larger than the opening portion of the first opening portion, the first opening portion and the second opening portion being connected, the through-holes having an axis perpendicular to the surface of the baffle member.

According to the gas processing apparatus of the present invention, since the opening area of the first opening portion of each of the through-holes is smaller than the opening area of the second opening portion of each of the through-holes, when gas delivered from the gas delivery pipe to the shower member flows in the first opening portions of the through-holes, since the flow resistance is large, the backing pressure of the baffle member becomes large. When the backing pressure of the baffle member becomes large, the irregularity of the dynamic pressure of the gas due to the spray flow from the gas outlet of the gas delivery pipe decreases. Thus, the irregularity of the backing pressure of the baffle member decreases. Consequently, the flow amount of the gas that flows in the through-holes becomes equal. When the irregularity of the dynamic pressure of the gas that flows in the first opening portion decreases due to a large pressure loss of the gas that flows in the first opening portion, the gas sprays from the first opening portion to the second opening portion that spreads from the first opening portion. The gas that flows in the second opening portion collides with the inner surface thereof and thereby decelerates. In addition, the second opening portion causes the flow rate of the gas to be uniform. Thus, the flow rate of the gas that flows from the second opening portion decelerates.

The shape of each through-hole of the baffle member is the same as that of the gas processing apparatus according to the first aspect of the present invention. Alternatively, each through-hole may be formed as a two-diameter hole or tapered. The shapes of the first opening portion and the second opening portion may be circles, ellipses, polygons, or the like.

According to the present invention, whether or not gas has been uniformly supplied to the entire surface of the workpiece is evaluated using a concept of uniformity of gas flow. The uniformity of gas flow can be expressed with the following approximate expression.

$$\text{Uniformity}=(G_{max}-G_{min})/(G_{max}+G_{min})$$

where $G_{max}$ is the maximum value of the max flow amount of the gas of the spray holes; and $G_{min}$ is the minimum value of the mass flow amount of the spray holes. The reason why the uniformity of the gas flow is represented with such an approximate expression is in that it is difficult to obtain the flow amount of the gas that flows in each spray hole and therefore the mass flow amount of the gas cannot be accurately obtained.

Next, a process for obtaining the uniformity of the gas flow will be described.

Generally, the flow pressure loss dP is given by the following Hagen—Poiseuille's expression deduced from Fanning's general expression.

$$-(dP/dL)=32U\mu/D^2$$

where D is the inner diameter of a cylindrical pipe; dL is the infinitesimal distance in the flow direction thereof; U is the average flow rate; ρ is the density of a fluid; $\mu$ is the viscosity thereof.

Under the operational pressure used in a gas processing apparatus (for example, a CVD apparatus), it can be assumed that gas be applied for equation of state of ideal gas. The difference pressure ΔP of the gas in the holes can be given by the following expression.

$$\Delta P=\{P_0^2+64\mu\, LRTG/(MD^2)\}^{0.5}-P_0$$

where $P_0$ is the downstream pressure of the holes; L is the length of the holes; R is the gas constant; T is the temperature; G is the average mass flow amount of the gas in the holes; and M is the molecular weight of the gas.

When the process pressure in the gas processing apparatus is a relatively reduced pressure, it is considered that the linear velocity of the gas delivered from the gas delivery pipe nearly increases to the sound velocity. Thus, it is necessary to consider the influence of the dynamic pressure of the gas flow. The dynamic pressure $P_D$ can be given by the following expression.

$$P_D=(0.5)\rho U2$$

When the maximum difference pressure $\Delta P_{max}$ and the minimum difference pressure $\Delta P_{min}$ are obtained in consideration with the dynamic pressure $P_D$, the maximum mass flow amount $G_{max}$ and the minimum mass flow amount $G_{min}$ can be obtained. Thus, the uniformity of the gas flow can be obtained.

These and other objects, features and advantages of the present invention will become more apparent in light of the following detailed description of a best mode embodiment thereof, as illustrated in the accompanying drawings.

DESCRIPTION OF PREFERRED EMBODIMENTS (First Embodiment)

Next, with reference to the accompanying drawings, a first embodiment of the present invention will be described. In the first embodiment, the present invention is applied to a CVD apparatus.

Figure 1:
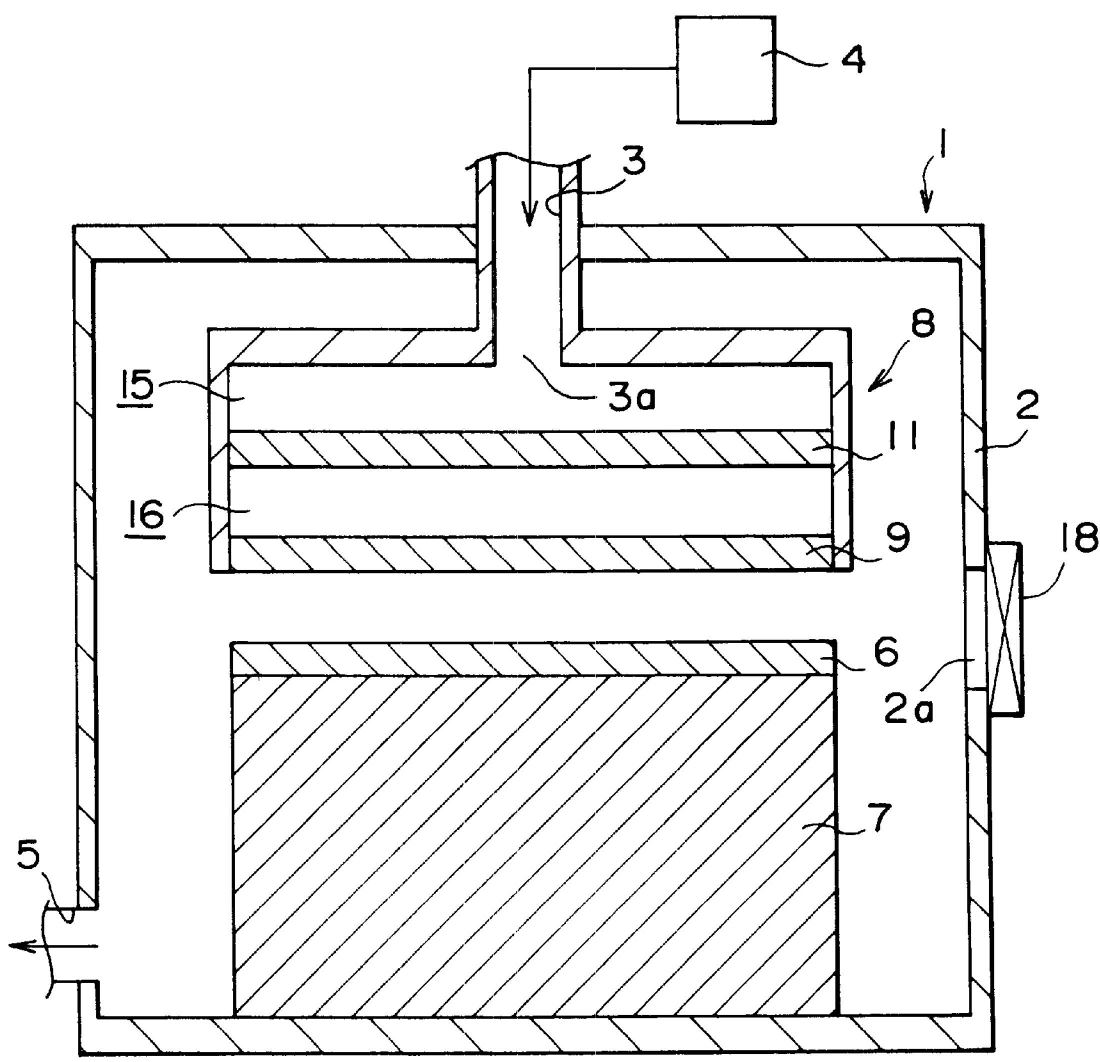
FIG. 1 is a sectional view showing the structure of a gas processing apparatus according to a first embodiment of the present invention.

FIG. 1 is a sectional view showing the structure of a gas processing apparatus according to the first embodiment of the present invention.

As shown in FIG. 1, a processing chamber 2 of the gas processing apparatus 1 is airtightly structured and made of aluminum or the like. The processing chamber 2 has a heating mechanism and a cooling mechanism (not shown).

A gas delivery pipe 3 is connected to an upper center portion of the processing chamber 2. The gas delivery pipe 3 delivers gas to the interior of the processing chamber 2. The interior of the processing chamber 2 and the interior of the gas delivery pipe 3 are connected. The gas delivery pipe 3 is connected to a gas supply source 4. Gas is supplied from the gas supply source 4 to the gas delivery pipe 3. The gas is delivered to the interior of the processing chamber 2 through the gas delivery pipe 3. The gas represents various types of gas used for forming a thin film on a workpiece (wafer). When necessary, inert gas is used as carrier gas.

A gas exhaust pipe 5 is connected to a lower portion of the processing chamber 2. The gas exhaust pipe 5 exhausts gas from the interior of the processing chamber 2. The gas exhaust pipe 5 is connected to an exhaust means (not shown). The exhaust means is composed of a vacuum pump or the like. The exhaust means exhausts the gas in the processing chamber 2 from the gas exhaust pipe 5 so as to keep the interior of the processing chamber 2 at a predetermined pressure.

A holding table 7 is disposed at a lower portion of the processing chamber 2. The holding table 7 holds a wafer 6 as a processing workpiece. According to the first embodiment, the wafer 6 is held on the holding table 7 by an electrostatic chuck (not shown). The diameter of the electrostatic chuck is almost the same as the diameter of the wafer 6. The holding table 7 has an inner heat source means (not shown). The heat source means controls the temperature on the processing surface of the wafer 6 at a predetermined temperature.

The holding table 7 has the size for a large wafer 6 (for example, a wafer with a diameter of 300 mm). When necessary, the holding table 7 has a mechanism that rotates the wafer 6. Since the gas processing apparatus 1 has the holding table 7 that is a larger holding table, a large wafer with a diameter of 300 mm can be processed. Thus, high yield and low fabrication cost can be achieved.

An opening portion 2*a* is disposed on a wall surface of the processing chamber 2 on the right of the holding table 7. The opening portion 2*a* is opened and closed by vertically moving a gate valve 18 (on the drawing of FIG. 1). In FIG. 1, a conveying unit (not shown) such as a main arm that conveys the wafer 6 is disposed on the right of the gate valve 18. The main arm enters the processing chamber 2 through the opening portion 2*a* and loads (places) the wafer 6 on the holding table 7. In addition, the main arm unloads a processed wafer 6 from the processing chamber 2.

A shower head 8 as a shower member is disposed at an upper portion of the holding table 7. The shower head 8 partitions the space between the holding table 7 and the gas delivery pipe 3. The shower head 8 is made of aluminum or the like.

At an upper center portion of the shower head 8, a gas outlet 3 of the gas delivery pipe 3 is disposed. Gas delivered to the interior of the processing chamber 2 is directly delivered to the interior of the shower head 8 disposed in the processing chamber 2.

Figure 2:
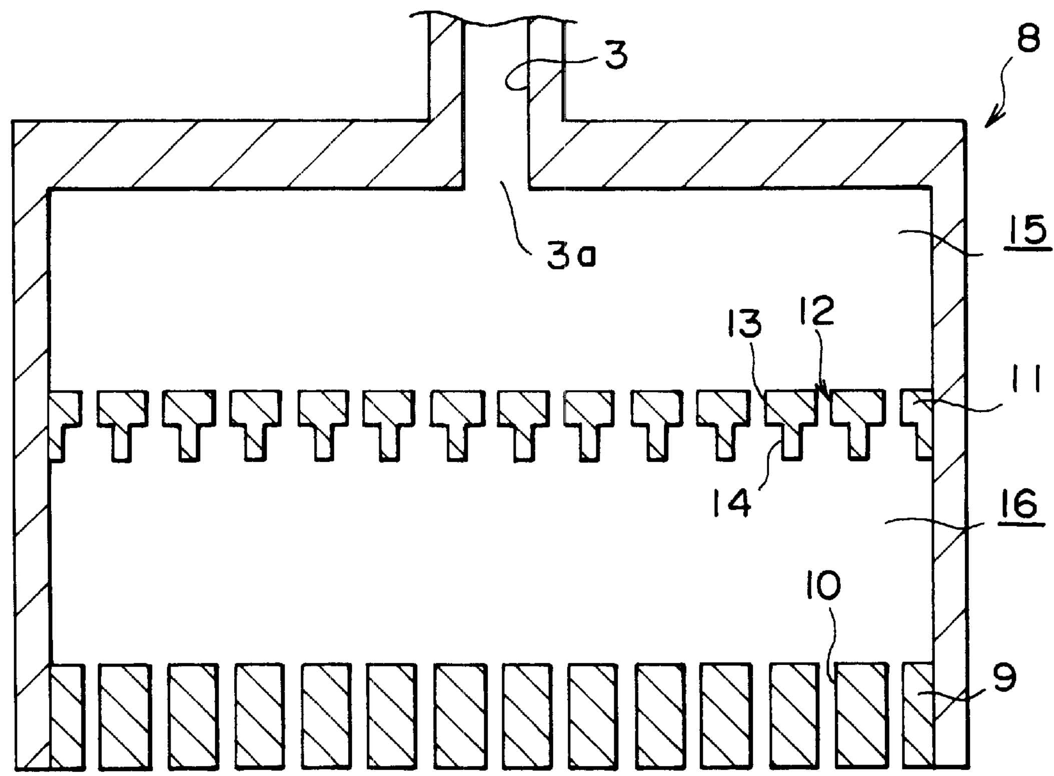
FIG. 2 is a sectional view showing the structure of a shower head according to the first embodiment of the present invention.

FIG. 2 is a sectional view showing the structure of the shower head 8. As shown in FIG. 2, a spray plate 9 is disposed on the bottom surface of the shower head 8. The spray plate 9 forms the bottom surface of the shower head 8 (namely, a partition that faces the holding table 7). Thus, the spray plate 9 faces the wafer 6. The spray plate 9 has many spray holes 10. Gas delivered to the interior of the shower head 8 is supplied to the wafer 6 through the spray holes 10 on the bottom surface of the shower head 8.

A baffle plate 11 as a baffle member is disposed between the spray plate 9 and the gas delivery pipe 3 in the shower head 8. According to the first embodiment, the baffle plate 11 is disposed in parallel with the spray plate 9 so that the baffle plate 11 partitions the space between the spray plate 9 and the gas delivery pipe 3.

Figure 3:
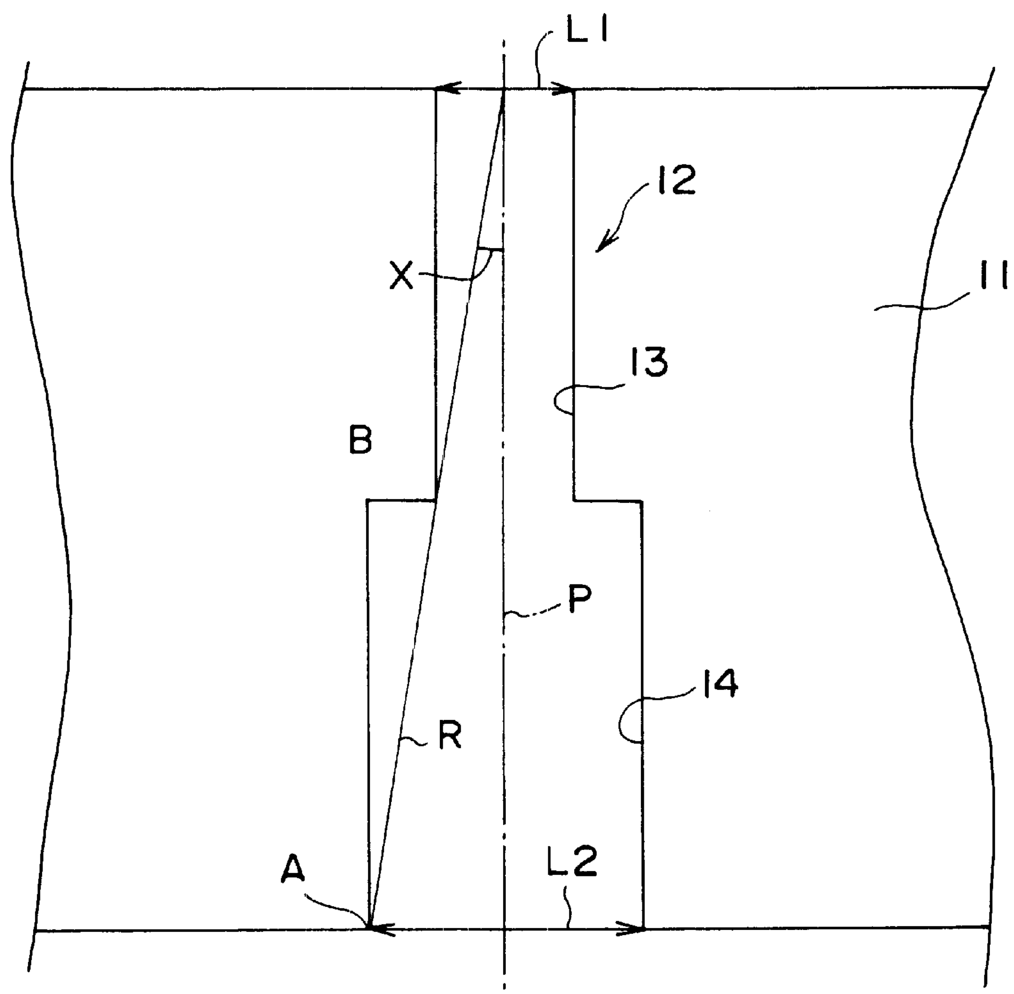
FIG. 3 is a schematic diagram showing a through-hole according to the first embodiment of the present invention.

The baffle plate 11 has many through-holes 12. FIG. 3 is a schematic diagram showing a through-hole 12. As shown in FIG. 3, the through-hole 12 is a two-diameter hole composed of an upper hole portion 13 (as a first opening portion) and a lower hole portion 14 (as a second opening portion). The diameter of the upper hole portion 13 is different from the diameter of the lower hole portion 14. The upper hole portion 13 and the lower hole portion 14 are connected on the same axis. The upper hole portion 13 faces the gas delivery pipe 3, whereas the lower hole portion 14 faces the spray plate 9.

The spread angle of the lower hold portion 14 of the through-hole 12 to the center axis P is in the range from 0.5 to 45 degrees, preferably in the range from 1 to 30 degrees. In this case, the spread angle is an angle X made by both a straight line R formed between a downstream edge A of the lower hole portion 14 that spreads and a downstream edge B of the upper hole portion 13 and the center axis P of the through-hole 12. The hole diameter L2 of the lower hold portion 14 is 2½ times or more larger than the hole diameter L of the upper hole portion 13, preferably two times larger than thereof.

The shower head 8 has a heating mechanism and a cooling mechanism as inner units (not shown). When CVD reaction gas is delivered to the interior of the shower head 8, the temperature in the shower head 8 is controlled so that it is lower than the reaction temperature and higher than the liquefying temperature of components of the CVD reaction gas.

Next, the operation of the gas processing apparatus 1 according to the first embodiment will be described.

First of all, the wafer 6 is placed on the holding table 7 by the electrostatic chuck. Thereafter, gas is supplied from the gas supply source 4 to the gas delivery pipe 3. The gas is delivered from the gas delivery pipe 3 to the interior of the shower head 8. The gas in the processing chamber 2 is exhausted by the exhausting means through the gas exhaust pipe 5. The interior of the processing chamber 2 is set at a predetermined pressure. The gas delivered from the gas delivery pipe 3 to the interior of the shower head 8 is sprayed to the surface of the wafer 6 through the through-holes 12 and the spray holes 10. The spray time of the gas depends on the gas type. According to the first embodiment, the spray time is in the range from several 10 seconds to 1 minute. Thermal energy on the wafer 6 causes the gas to be a chemically reactive seed. The chemical reaction of the reactive seed causes a thin film to be formed on the wafer 6.

When the gas is delivered to the interior of the shower head 8, the dynamic pressure of the gas rises in the vicinity of the gas outlet 3*a* of the gas delivery pipe 3 because of the gas that sprays from the gas output 3*a*. However, since the diameter of the upper hole portion 13 of each of the through-holes 12 is small, the upper hole portion 13 impedes the flow of the gas. Thus, the flow pressure loss of the gas that flows in the upper hole portion 13 becomes large. Consequently, the difference between the pressure on the upstream side of the baffle plate 11 and the pressure on the downstream side thereof (namely, the difference between the pressure in the baffle space 15 and the pressure in the shower pre-chamber 16) becomes large. As a result, the backing pressure of the baffle plate 11 becomes large. In addition, the pressure in the baffle space 15 on the upstream side becomes large. Thus, the dynamic pressure of the gas that sprays from the gas delivery pipe lowers. Consequently, the ratio of the local irregularity of the baffle backing pressure due to the collision of the gas that sprays from the gas delivery pipe against the difference pressure of the baffle plate decreases. Thus, the flow amount of the gas that flows in the through-holes 12 becomes almost constant.

In addition, since the spread angle of the lower hole portion 14 is 45 degree or less, the gas that flows from the upper hole portion 13 to the lower hole portion 14 of each of the through-holes 12 collides with the wall surface (inner surface) of the lower hole portion 14 and thereby the flow rate of the gas decelerates. The gas that flows in the lower hole portion 14 becomes uniform and decelerates. In particular, when the spread angle of the lower hole portion 14 is in the range from 1 to 30 degrees, the gas securely collides with the inner surface of the lower hole portion 14. Thus, the flow rate of the gas that flows in the lower hole portion 14 effectively decelerates.

Figure 4:
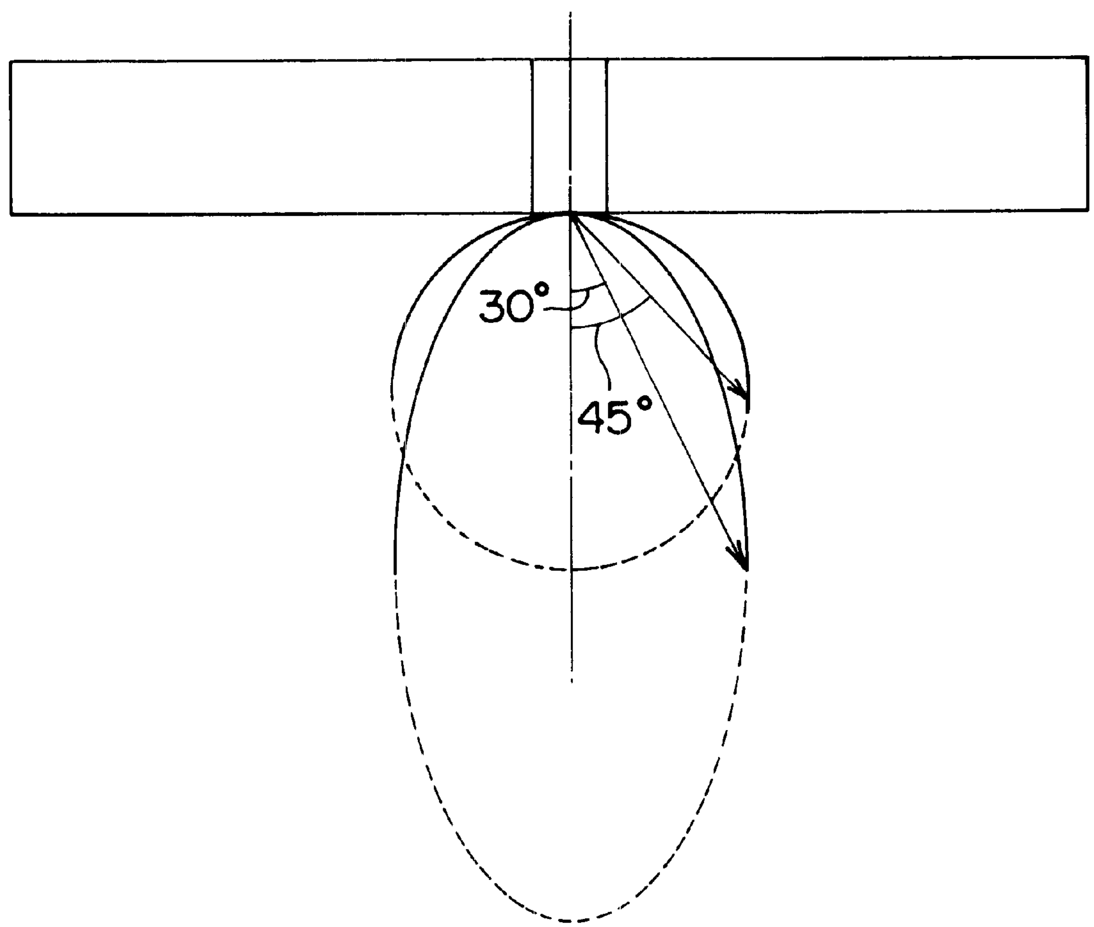
FIG. 4 is a schematic diagram showing a flow rate distribution of gas that sprays from a through-hole.

The sectional shape of the flow rate distribution of the gas that sprays from the upper hole portion 13 of each of the through-holes 12 is elliptical in the viscous flow region of which the gas pressure exceeds 1 Torr as shown in FIG. 4. The flow rate of the gas deteriorates in proportion to the distance from the center of the viscous flow region. When the spread angle is 45 degrees, the gas viscosity is the lowest and the sectional shape thereof is a perfect circle. When the spread angle of each of the through-holes 12 is larger than 45 degrees, since the gas does not spread to the inner surface of the lower hole portion 14, the gas becomes a free flow that separates from the inner surface of the lower hole portion 14. Thus, the flow rate of the gas that sprays from the lower edge of the lower hole portion 14 does not decrease reversely in proportion to the opening area of the lower edge of the lower hole portion 14.

The relation between the flow rate of gas and the opening area is given by the following expression.

Flow rate of gas=flow amount of gas/opening area

Thus, when the flow amount of gas is constant, the flow rate of the gas that flows in a hole is inversely proportional to the opening area. The dynamic pressure of gas is inversely proportional to the square of the opening area. For example, when the hole diameter (L2) of the lower hole portion 14 is two times larger than the hole diameter (L1) of the upper hole portion 13 (namely, L2/L1=2), the sectional area of the former is four times larger than that of the latter. Thus, the flow rate of the gas in the upper hole portion 13 of each of the through-holes 12 is 4 times larger than that of the lower hole portion 14 thereof. The dynamic pressure of the gas in the upper hole portion 13 is 16 times larger than that of the gas in the lower hole portion 14.

Thus, the hole diameter L2 of the lower hole portion 14 is inversely proportional to the dynamic pressure. The hole diameter L2 of the lower hole portion 14 is 2½ times or more larger than that of the hole diameter L1 of the upper hole portion 13, preferably 2 times or more larger than that thereof.

Thus, the baffle plate 11 is disposed in such a manner that the upper hole portion 13 and the lower hole portion 14 of each of the through-holes 12 face the gas delivery pipe 3 (namely, on the upstream side of the through-holes 12) and the spray plate 9 (namely, on the downstream side of the through-holes 12), respectively. Since the pressure in the baffle chamber rises due to a relatively large flow resistance of the gas that flows in the upper hole portions 13 that have small opening areas, the irregularity of flow amounts of the gas that flow in the through-holes decreases due to the local irregularity of the backing pressure of the dynamic pressure of the gas that sprays from the gas delivery pipe against the baffle plate. In addition, the flow rate of the gas that flows in the lower hole portions 14 that have large opening areas decelerates. Thus, the ratio of the influence of the irregularity of the dynamic pressure of the gas that sprays from the through-holes to the downstream side against the spray plate further decreases. In such a manner, the effect of the upper hole portions 13 and the effect of the lower hole portions 14 allow the flow amount of the shower gas to become uniform.

Since the hole diameter on the downstream side of each of the through-holes 12 is larger than that on the upstream side hole diameters thereof, the dynamic pressure of the gas that flows from the through-holes 12 decreases. Thus, the irregularity of the dynamic pressure of the gas decreases. Consequently, the irregularity of the dynamic pressure of the gas can be substantially ignored in comparison with the flow pressure loss of the spray holes 10. Thus, the gas uniformly sprays from the spray holes 10. The gas is uniformly supplied to the entire surface of the wafer.

Next, the effect of the first embodiment will be described with a practical example.

EXAMPLE OF FIRST EMBODIMENT

In an example, the molecular weight of gas was 28 g/mol (nitrogen). The gas density was $2.55\times10^{-3}$ kg/m$^3$. The gas viscosity was $1.76\times10^{-5}$ Pa·s. The inner temperature of the processing chamber was 27° C. The inner pressure of the processing chamber was 1.7 Torr. The inner diameter of the gas delivery pipe 3 was 7 mm. The gas supply amount (gas flow amount) of the gas supply source 4 was 2000 sccm.

The plate thickness of the spray plate 9 was 10 mm. The spray plate 9 had 641 spray holes 10 that were uniformly formed on the entire surface thereof. The hole diameter of each spray hole 10 was 1 mm.

The plate thickness of the baffle plate 11 was 7 mm. The baffle plate 11 had 641 through-holes 12 that were uniformly formed on the entire surface thereof. The hole diameter L1 of the upper hole portion 13 of each through-hole 12 was 1 mm. The hole length of the upper hole portion 13 was 3.5 mm. The hole diameter L2 of the lower hole portion 14 of each through-hole 12 was 2 mm. The hole length of the lower hole portion 14 was 3.5 mm. Thus, the ratio between L2/L1 was 2. The spread angle was around 8.1 degrees.

Corresponding to the formulas for the dynamic pressure, the difference pressure, and the uniformity, the uniformity of the example of the first embodiment was obtained.

In the example of the first embodiment, nitrogen gas was used. In a plasma TiN process as a real gas process, since a large amount of nitrogen gas is used, the physical factors of such as $TiCl_4$ as an additive added for a small amount can be omitted without an influence of the calculated results.

In addition, using the following comparison examples, the uniformity of gas flow was obtained. In a first comparison example, the baffle plate 11 was not used. In a second comparison example, each of the through-holes 12 was a straight hole with a diameter of 1 mm. In a third comparison example, each of the through-holes 12 was a straight hole with a diameter of 2 mm. In a fourth comparison example, the hole diameters of the upper hole portion and the lower hole portions were inverted so that the hole diameters of the upper hole portion and the lower hole portion were 2 mm and 1 mm, respectively.

TABLE 1

| | Uniformity (%) |
|---|---|
| First embodiment | 0.39 |
| First comparison example | 42.9 |
| Second comparison example | 2.59 |
| Third comparison | 20.6 |
| Fourth comparison example | 7.88 |

As shown in Table 1, the uniformity of gas flow in the example of the first embodiment was 0.39. In contrast, the uniformity of gas flow in the second comparison example was 2.59% that is seven times larger than that of the example of the first embodiment. In the example of the first embodiment, since the lower hole portion 14 spreads from the upper hole portion 13 (namely, the diameter of the lower hole portion 14 is larger than that of the upper hole portion 13), the value of the uniformity of gas flow in the example of the first embodiment is small. Thus, since the flow rate of the gas that flows in the lower hole portion 14 decreases, the dynamic pressure of the gas that sprays from the lower hole portion 14 lowers. Thus, the influence of the irregularity of the dynamic pressure of the through-holes due to the irregularity of the flow amounts thereof against the irregularity of the pressure on the entire rear surface of the spray plate becomes small. The value of the uniformity of gas flow in the third comparison example of which the hole diameter of the upper hole portion 13 is the same as the hole diameter of the lower hole portion 14 is 20.6% that is around eight times larger than that in the second comparison example. This is because when the hole diameter of the upper hole portion increases, the flow pressure loss of the gas that flows in the through-holes decreases. Thus, the influence of the dynamic pressure of the gas is delivered from the gas delivery pipe relatively increases and thereby the irregularity of the pressure on the rear surface of the baffle plate becomes large. Since the irregularity of the flow amounts of the through-holes increases, the irregularity of the flow amounts of the shower gas causes the irregularity of the backing pressure of the through-holes to increase. Thus, the irregularity of the flow amounts of the shower gas in the third comparison example becomes larger than that in the second comparison example.

In the fourth comparison example of which the relation between the hole diameters of the upper hole portion and the lower hole portion of each of the through-holes was inverted, the uniformity of gas flow in the fourth comparison example is 7.88% that is nearly 20 times larger than that in the example of the first embodiment. As with the second comparison example and the third comparison example, in the fourth comparison example, the uniformity of gas flow becomes small only because of the flow pressure loss of the gas that flows in the through-holes 12. Thus, since the lower hole portion that largely spreads is disposed in such a manner that it faces the spray plate 9, it causes the flow rate of the gas to decrease. Consequently, the irregularity of the dynamic pressure of the gas that sprays from the lower hole portions 14 decreases. Thus, it is clear that the value of the uniformity of gas flow in the example of the first embodiment is much smaller than that of each of the comparison examples.

Next, in the above-described conditions, the uniformity of gas flow was obtained in the case that the hole diameters of the upper hole portion 13 and the lower hole portion 14 of each through-hole was varied in the range from 0.2 mm to 3 mm. The results are shown in Table 2 and FIG. 5.

TABLE 2

| Upper hole/ Lower hole | 0.2 mm | 0.3 mm | 0.4 mm | 0.5 mm | 0.75 mm | 1.0 mm | 1.25 mm | 1.5 mm | 2.0 mm | 2.5 mm | 3.0 mm |
|---|---|---|---|---|---|---|---|---|---|---|---|
| 0.2 mm | 1.53E−1 | 2.49E−1 | 1.07E−1 | 4.50E−2 | 8.04E−3 | 2.40E−3 | 9.59E−4 | 4.58E−4 | 1.44E−4 | 5.89E−5 | 2.84E−5 |
| 0.3 mm | 2.59E−1 | 7.98E−1 | 4.73E−1 | 2.27E−1 | 4.40E−2 | 1.33E−2 | 5.35E−3 | 2.56E−3 | 8.05E−4 | 3.29E−4 | 1.59E−4 |
| 0.4 mm | 2.94E−1 | 1.25 | 1.06 | 6.38E−1 | 1.50E−1 | 4.70E−2 | 1.91E−2 | 9.17E−3 | 2.89E−3 | 1.18E−3 | 5.70E−4 |
| 0.5 mm | 3.05E−1 | 1.47 | 1.57 | 1.20 | 3.81E−1 | 1.29E−1 | 5.36E−2 | 2.59E−2 | 8.23E−3 | 3.37E−3 | 1.63E−3 |
| 0.75 mm | 3.11E−1 | 1.64 | 2.13 | 2.23 | 1.62 | 8.26E−1 | 4.01E−1 | 2.06E−1 | 6.82E−2 | 2.83E−2 | 1.37E−2 |
| 1.0 mm | 3.12E−1 | 1.67 | 2.26 | 2.59 | 2.98 | 2.59 | 1.74 | 1.05 | 3.93E−1 | 1.69E−1 | 8.30E−2 |
| 1.25 mm | 3.12E−1 | 1.68 | 2.30 | 2.71 | 3.78 | 4.72 | 4.55 | 3.54 | 1.67 | 7.79E−1 | 3.94E−1 |
| 1.5 mm | 3.13E−1 | 1.68 | 2.31 | 2.75 | 4.16 | 6.33 | 7.98 | 7.98 | 5.17 | 2.75 | 1.47 |
| 2.0 mm | 3.13E−1 | 1.68 | 2.32 | 2.78 | 4.45 | 7.88 | 12.9 | 17.7 | 20.6 | 16.1 | 10.7 |

Figure 5:
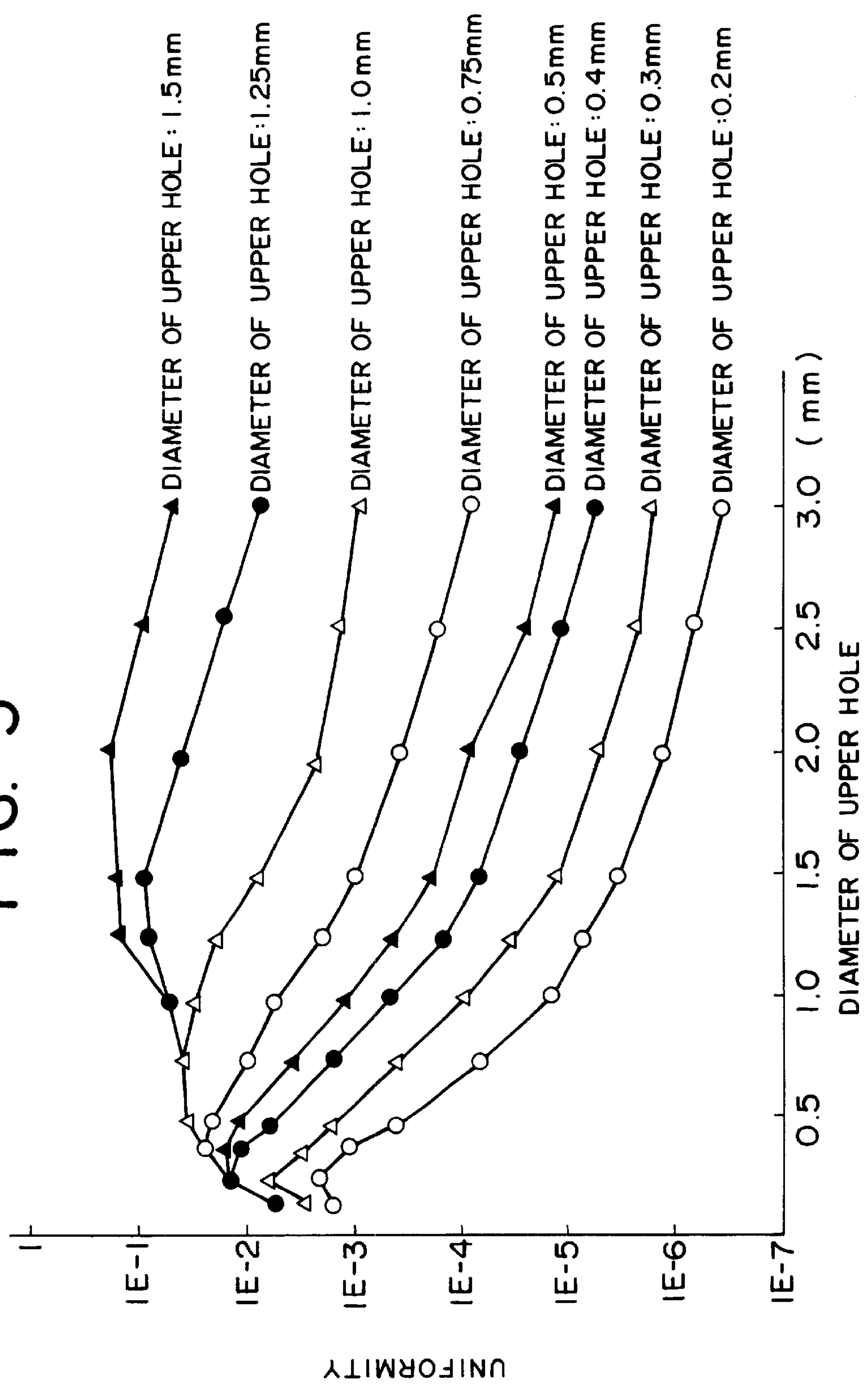
FIG. 5 is a graph showing an influence against uniformity due to the variation of diameters of through-holes.

As shown in Table 2 and FIG. 5, when the hole diameter of the lower hole portion 14 is 1.5 times larger than that of the upper hole portion 13, it is clear that the value of the uniformity of gas flow decreases ½ to ⅓ or less. In particular, when the hole diameter of the lower hole portion 14 is twice larger than that of the upper hole portion 13, the value of the uniformity of gas flow decreases 1/10 or less. Since the downstream side (lower hole portion 14) of each through-hole 12 largely spreads, the flow rate of the gas that flows in the lower hole portion 14 decelerates. Thus, the dynamic pressure of the gas that sprays from the lower hole portion decreases.

In addition, when the hole diameter of the lower hole portion 14 is larger than the hole diameter of the upper hole portion 13, the flow rate of the gas that flows in the lower hole portion 14 decelerates. Thus, the dynamic pressure that sprays from the lower hole portion 14 decreases. When the hole diameter of the upper hole portion 13 is 1 mm, the value of the uniformity of gas flow in the case that the hole diameter of the lower hole portion 14 is 0.3 mm is almost the same as the value of the uniformity of gas flow in the case that the hole diameter of the lower hole portion 14 is 1.25.

When the hole diameter of the lower hole portion 14 is decreased, the value of the uniformity of gas flow decreases to some extent because of the decrease of the irregularity of the dynamic pressure due to the rise of the pressure in the baffle chamber. However, it is clear that when the hole diameter of the lower hole portion 14 is further increased, the value of the uniformity of gas flow further decreases. Since the hole length of the lower hole portion 14 is fixed to 3.5 mm, the spread angle of each of the through-holes 12 is 45 degrees or less.

Table 2 and FIG. 5 show that the value of the uniformity of gas flow in the case that each through-hole 12 is a straight hole with a hole diameter of 0.5 mm is almost the same as that in the case that the hole diameter of the upper hole portion 13 is 1 mm and the hole diameter of the lower hole portion 14 is 1.5 mm. Thus, the same value of the uniformity of gas flow can be achieved without need to form holes with small diameters that result in fabrication difficulty and high fabrication costs.

Next, the uniformity of gas flow was obtained in the case that the flow amounts of gas were 4000 sccm and 6000 sccm in addition to 2000 sccm while the hole diameters of the upper hole portion 13 and the lower hole portion 14 of each through-hole were being varied. For reference, the uniformity was obtained in the case that each through-hole was a straight hole with a hole diameter of 1 mm. The results were shown in Table 3.

TABLE 3

| Upper hole portion | Lower hole portion | (%) 2000 sccm | 4000 sccm | 6000 sccm |
|---|---|---|---|---|
| 0.5 mm | 1.0 mm | 0.13 | 0.55 | 1.31 |
| 0.75 mm | 1.5 mm | 0.21 | 1.08 | 2.57 |
| 1.0 mm | 1.25 mm | 1.74 | 10.5 | 20.8 |
| 1.0 mm | 2.0 mm | 0.39 | 2.24 | 4.51 |
| 1.0 mm | 2.5 mm | 0.17 | 0.95 | 1.92 |
| 1.0 mm | 1.0 mm | 2.59 | 16.1 | 31.8 |

As shown in Table 3, based on the case that the gas flow amount was 2000 sccm regardless of the hole diameters of the upper hole portion 13 and the lower hole portion 14, when the gas flow amount was 4000 sccm, the value of the uniformity of gas flow increased around five times; and when the gas flow amount was 6000 sccm, the value of the uniformity of gas flow increases around 10 times.

Thus, according to the present invention, it is clear that even if the flow amount of gas is varied, the same effect can be obtained.

Next, in the conditions that the molecular weight of gas was 35 g/mol, the viscosity thereof was $2.6\times10^{-5}$ Pa·S, and the inner pressure of the processing chamber was 80 Torr, the hole diameters of the upper hole portion 13 and the lower hole portion 14 of each through-hole 12 were varied and the uniformity of gas flow was obtained. For reference, the uniformity of gas flow in the case that each through-hole was a straight hole with a hole diameter of 1 mm was obtained. The results are shown in Table 4.

TABLE 4

| Upper hole portion | Lower hole portion | (%) 2000 sccm | 4000 sccm | 6000 sccm |
|---|---|---|---|---|
| 0.5 mm | 1.0 mm | 0.09 | 0.39 | 0.92 |
| 1.0 mm | 2.0 mm | 0.25 | 1.63 | 5.04 |
| 1.0 mm | 1.0 mm | 1.78 | 11.1 | 32.3 |

As shown in Table 4, when the gas type was changed, the same effect as the case that the gas flow amount was varied was obtained regardless of the hole diameters of the upper hole portion 13 and the lower hole portion 14. Thus, according to the present invention, it is clear that even if the gas type is varied, the same effect can be obtained.

As the above-described results, the inventor of the present invention knows the following points.

When the hole diameter and hole length of the upper hole portion 13 are designated in such a manner that the flow pressure loss against the average flow amount per through-hole 12 is twice or more times larger than the dynamic pressure of the gas that sprays from the gas outlet of the gas delivery pipe 3, more preferably five times or more larger than that thereof, because of the flow pressure loss of the gas that flows in the upper hole portion 13, the influence of the dynamic pressure of the gas that sprays from the gas outlet decreases.

When the hole diameter and hole length of the lower hole portion 14 are designated in such a manner that the dynamic pressure of the gas that sprays from the lower edge of each through-hole 12 against the average flow amount per through-hole 10 is ½ times or less smaller than that of the flow pressure loss against the average flow amount per spray hole 10, preferably ⅕ times or less smaller than that thereof, the flow rate of the gas that flows in the lower hole portion 14 effectively decelerates. Thus, the influence of the dynamic pressure of the gas that sprays from the lower hole portion 14 decreases.

When the number of through-holes 12 is designated in such a manner that the distance between two adjacent through-holes 12 is twice or less smaller than the distance between the baffle plate 11 and the spray plate 9, preferably one time or less smaller than that thereof, the influence of the dynamic pressure of the gas that flows in each through-hole 12 decreases.

According to the first embodiment, since the upper hole portion 13 is disposed in such a manner that it faces the gas delivery pipe 3, the flow pressure loss of the gas that flows in the upper hole portion 13 becomes large and thereby the irregularity of the flow amounts of the gas of the through-holes becomes small. In addition, since the lower hole portion 14 that spreads from the upper hole portion 13 is disposed in such a manner that the lower hole portion 14 faces the spray plate 9, the flow rate of the gas that flows in the lower hole portion 14 decelerates. Thus, the dynamic pressure of the gas that sprays from the lower edge of the lower hole portion 14 of each through-hole 12 decreases. Consequently, the gas can be uniformly supplied to the entire surface of the wafer 6.

According to the first embodiment, almost the same uniformity as small through-holes 12 can be achieved without fabrication difficulty and high fabrication cost.

Figure 15:
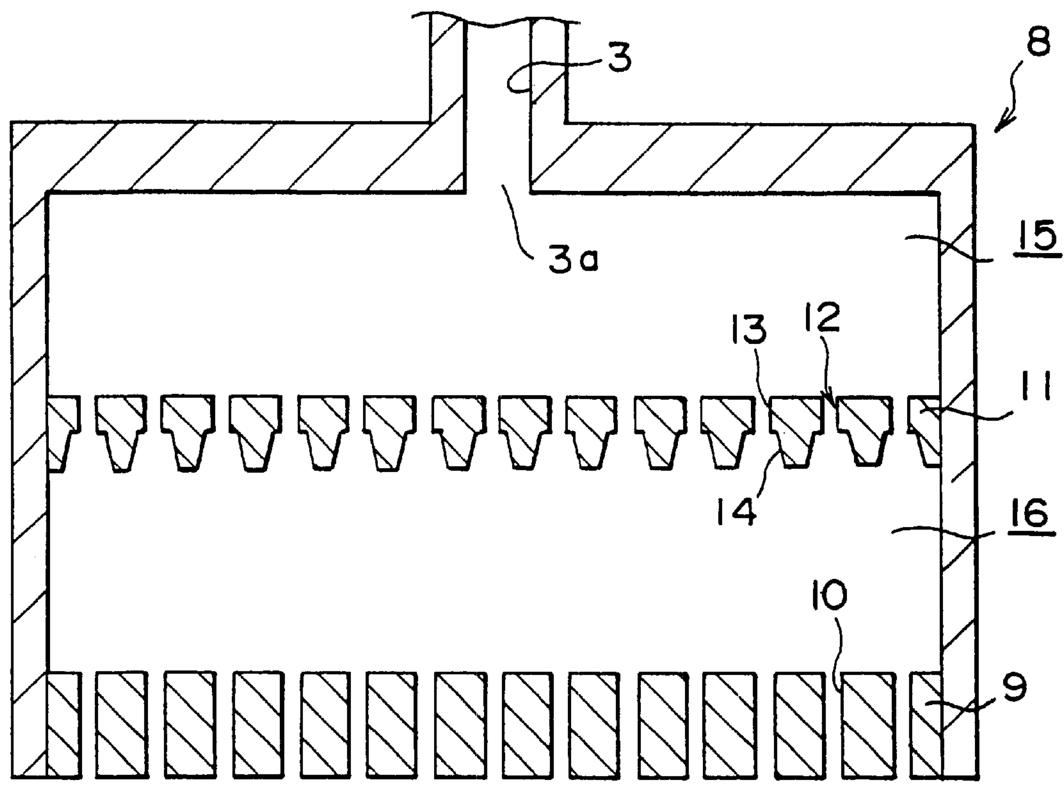
FIG. 15 is a sectional view showing the structure of a shower head having tapered lower holes in the baffle plate.

Since each of through-holes 12 has two hole portions with different hole diameters (these two hole portions are the upper hole portion 13 and the lower hole portion 14), they can be easily formed. For example, large diameter holes are formed on the baffle plate 11 using a drill bit with a large diameter. Thereafter, small diameter holes are formed at the bottoms of the large diameter holes of the baffle plate 11 using a drill bit with a small diameter. Since the hole length of these through-holes 12 is smaller than the hole length of straight holes whose hole diameters do not vary, the service life of the small diameter drill bit can be prolonged. Alternatively, below an upper hole portion, a lower hole portion may be formed in a taper shape, as shown in FIG. 15 rather than the cylindrical shape using a tapered drill bit.

(Second Embodiment)

Next, with reference to the accompanying drawings, a second embodiment of the present invention will be described.

In the second embodiment, similar portions to those in the first embodiment are denoted by similar reference numerals and their description is omitted.

Next, the different points from the first embodiment will be mainly described.

Figure 6:
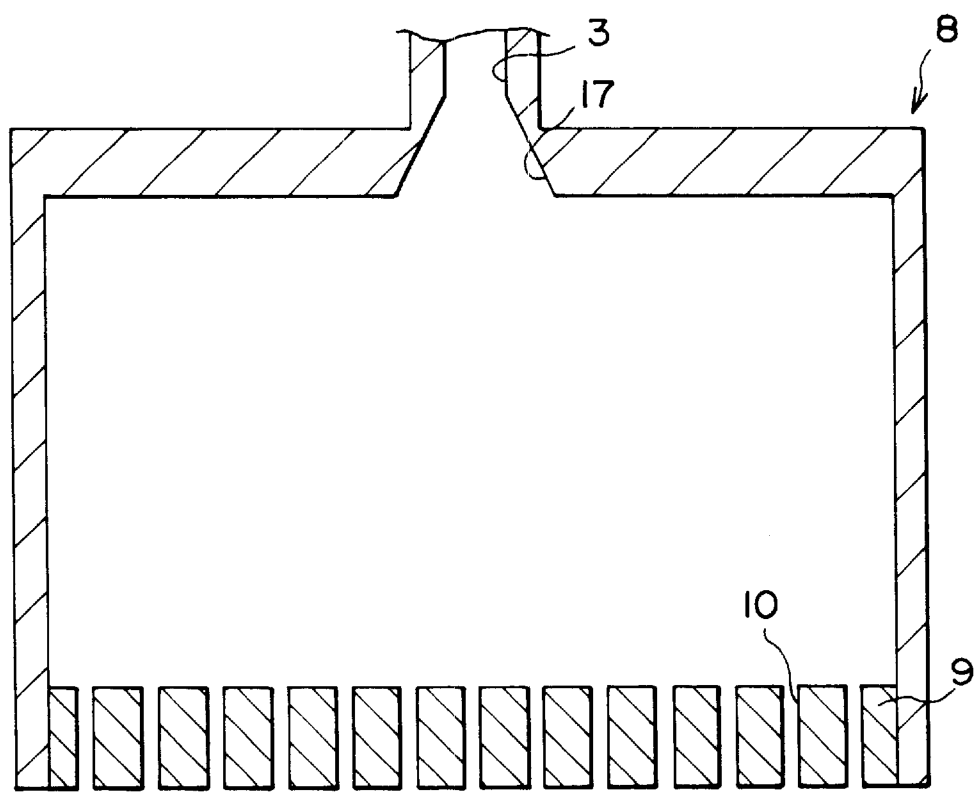
FIG. 6 is a sectional view showing the structure of a shower head according to a second embodiment of the present invention.

FIG. 6 is a sectional view showing the structure of a shower head 8 according to the second embodiment of the present invention.

As shown in FIG. 6, in the second embodiment, the baffle plate 11 according to the first embodiment is not disposed. In addition, the shape of the gas outlet of the gas delivery pipe 3 of the first embodiment was changed.

According to the second embodiment, a gas outlet 17 is connected to a processing chamber 2 of a gas delivery pipe 3. The gas outlet 17 spreads toward a shower head 8. The gas outlet 17 spreads with a spread angle in the range of 0.5 to 45 degrees, preferably in the range from 1 to 30 degrees, against the center axis of the gas delivery pipe 3. In addition, the hole diameter of the gas outlet 17 is 1.5 times or more larger than that of the gas delivery pipe 3, preferably two times or more larger than that thereof.

According to the second embodiment, gas that flows from the gas delivery pipe 3 to the gas outlet 17 collides with the wall surface (inner surface) of the gas outlet 17 and thereby decelerates. In addition, the flow rate of the gas in the gas outlet 17 becomes uniform. According to the second embodiment, corresponding to the formula of the relation between the gas flow rate and the opening area, the flow rate at the gas outlet 17 that spreads is ½ times or less smaller than that at a gas outlet that does not spread, preferably ¼ times or less smaller than that thereof. Since the flow rate of the gas that flows in the gas outlet 17 decelerates, the dynamic pressure of the gas that sprays from the gas outlet 17 decreases. Thus, the irregularity of the dynamic pressure of the gas decreases. Consequently, the dynamic pressure of the gas that sprays from the gas outlet 17 can be substantially ignored in comparison with the flow pressure loss of the spray holes 10. Thus, the gas uniformly sprays from the spray holes 10. The gas is uniformly supplied to the entire surface of the wafer 6.

Next, with reference to a real example of the second embodiment, the effect thereof will be described.

EXAMPLE OF SECOND EMBODIMENT

In the example of the second embodiment, in the same conditions as the example of the first embodiment, the uniformity of gas flow was obtained by varying the hole diameter of the gas outlet 17 in the range from 7 mm to 20 mm. The results are shown in Table 5.

TABLE 5

(%)

| Gas outlet | Second embodiment | Fifth embodiment | Sixth embodiment |
|---|---|---|---|
| 7.0 mm | 42.9 | 0.3932 | 2.59 |
| 10.0 mm | 13.7 | 0.0495 | 0.37 |
| 12.5 mm | 5.93 | 0.0169 | 0.143 |
| 15.0 mm | 2.93 | 0.0076 | 0.065 |
| 17.5 mm | 1.59 | 0.0040 | 0.035 |
| 20.0 mm | 0.94 | 0.0023 | 0.020 |

As shown in Table 5, it is clear that as the hole diameter of the gas outlet 17 becomes large, the value of the uniformity of gas flow becomes small. When the hole diameter of the gas outlet 17 is 10 mm, the value of the uniformity of gas flow is 13.7%. The value of the uniformity of gas flow in this case is superior to 20.6% (see Table 1) in the case of the baffle plate 11 having straight holes with a hole diameter of 2 mm as the third comparison example of the first embodiment. The value of the uniformity of gas flow in the case that the hole diameter of the gas outlet 17 is 15 mm is 2.93%. Thus, the value of the uniformity of gas flow in the case is 2.59% that is almost the same as the case that the baffle plate 11 having straight holes with a hole diameter of 1 mm is disposed (as the second comparison example of the first embodiment shown in Table 1). Thus, it is clear that when the gas outlet 17 spreads toward the shower head 8 with a spread angle of 45 degrees or less against the center axis of the gas delivery pipe 3, the same effect as the case that the baffle plate 11 is disposed can be achieved.

According to the second embodiment, since the gas outlet 17 spreads toward the shower head 8 with a spread angle of 45 degrees or less against the center axis of the gas delivery pipe 3, the flow rate of the gas that flows in the gas outlet 17 effectively decelerates. Thus, the influence of the dynamic pressure of the gas that sprays from the gas outlet 17 decreases. Consequently, the gas can be uniformly supplied to the entire surface of the wafer 6.

According to the second embodiment, the gas can be uniformly suppled to the entire surface of the wafer 6 without need to use the baffle plate 11. Thus, the structures of the shower head 8 and the gas processing apparatus 1 can be simplified.

(Third Embodiment)

Next, with reference to the accompanying drawings, a third embodiment of the present invention will be described.

Figure 7:
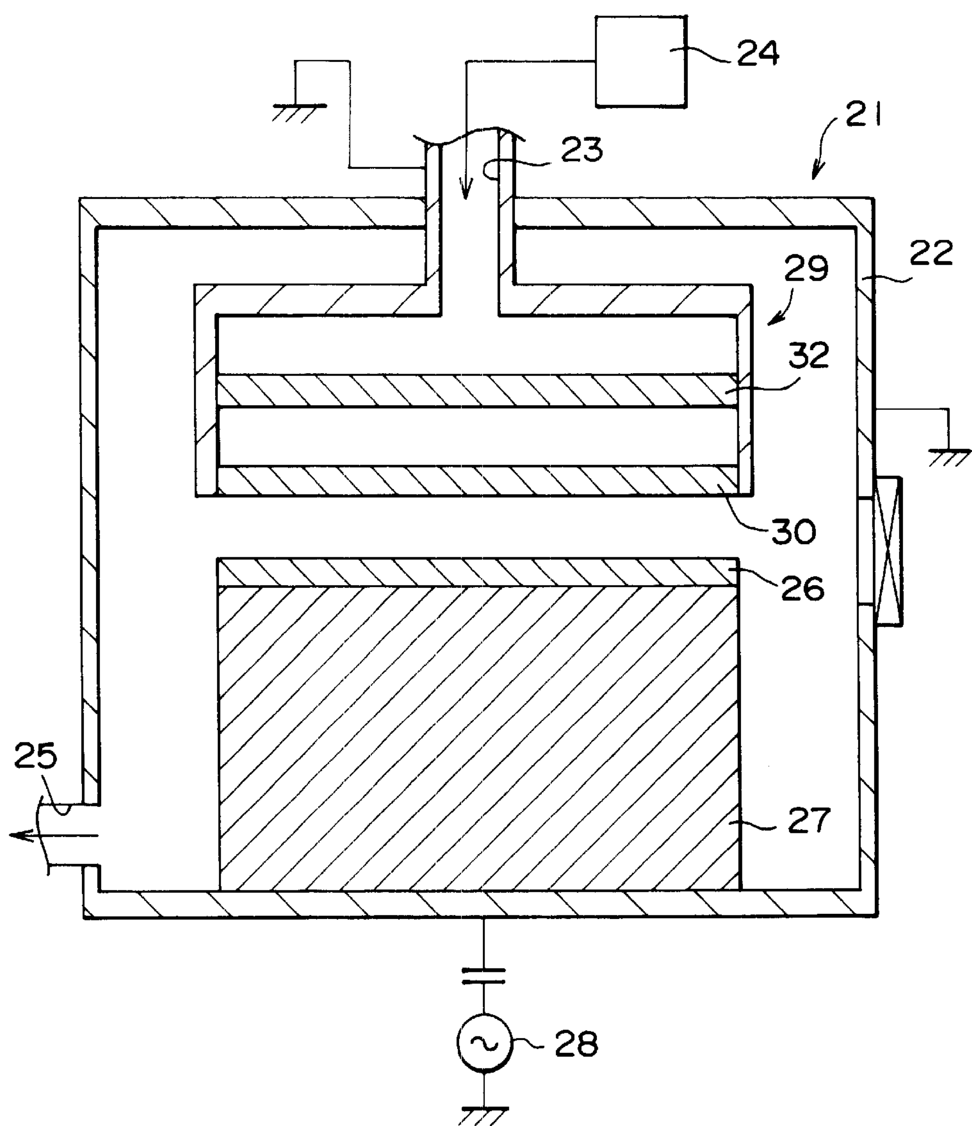
FIG. 7 is a sectional view showing the structure of a gas processing apparatus according to a third embodiment of the present invention.

According to the third embodiment, the present invention is applied to an etching apparatus. FIG. 7 is a sectional view showing the structure of the etching apparatus according to the third embodiment of the present invention.

As shown in FIG. 7, the etching apparatus 21 is a gas processing apparatus. The etching apparatus 21 has a processing chamber 22 that is airtightly structured. A gas delivery pipe 23 is connected to an upper center portion of the processing chamber 22. A gas supply source 24 is connected to the gas delivery pipe 23. The gas supply source 24 supplies gas to the processing chamber 22 through the gas delivery pipe 23. A gas exhaust pipe 25 is disposed at a lower portion of the processing chamber 22. The interior of the processing chamber 22 is set to a predetermined pressure.

A holding table 27 is disposed at a lower portion of the processing chamber 22. The holding table 27 holds a wafer 26. A shower head 29 is disposed above the holding table in such a manner that the shower head 29 faces the wafer 26. The shower head 29 sprays the gas to the wafer 26.

As shown in FIG. 7, the holding table 27 is connected to a radio frequency power supply 28. When the wafer 26 is processed, the radio frequency power supply 28 applies a radio frequency power to the holding table 27. The shower head 23 and the housing of the processing chamber 22 are grounded.

In the etching apparatus, the holding table 27 operates as a lower electrode. A glow discharge takes place between the lower electrode and an upper electrode (that will be described later). The glow discharge causes the gas delivered to the processing chamber 22 to become a plasma. For example, with ion particles or radical particles as a plasma, the etching process is performed for the wafer 26.

Figure 8:
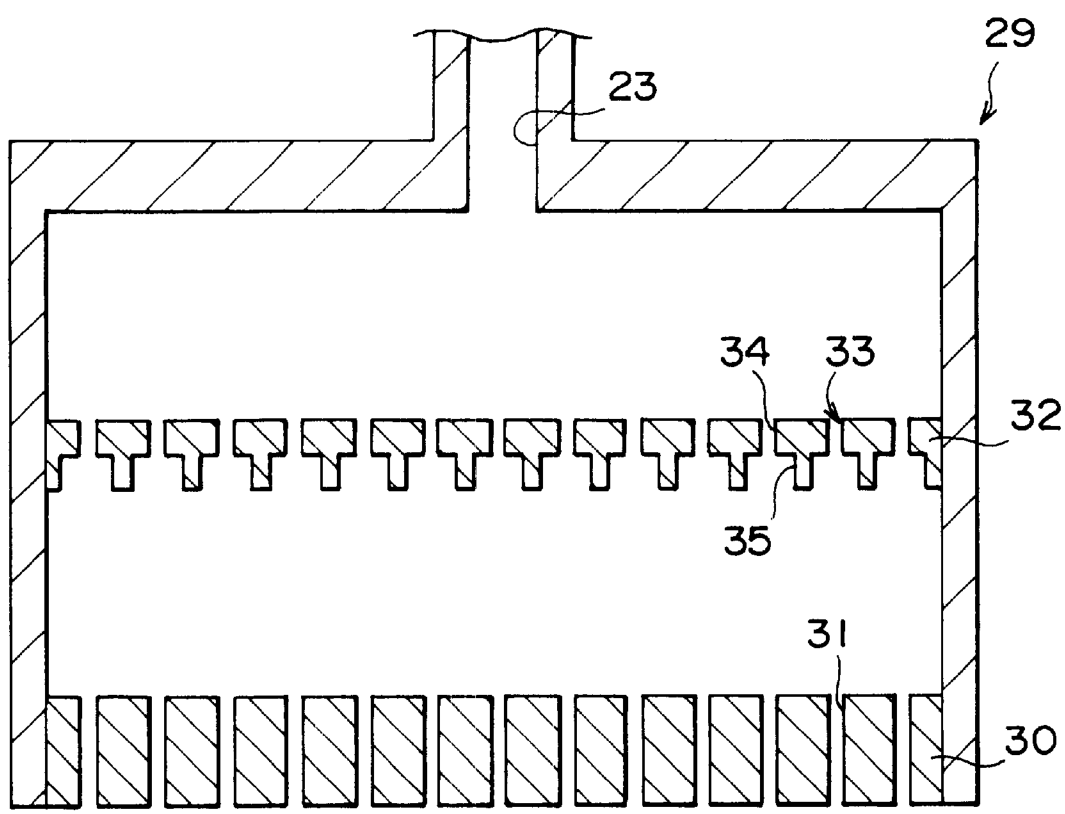
FIG. 8 is a sectional view showing the structure of a shower head according to the third embodiment of the present invention.

FIG. 8 is a sectional view showing the structure of the shower head 29. As shown in FIG. 8, a spray plate 30 is disposed on the bottom surface of the shower head 29. As described above, the radio frequency power applied to the holding table 27 causes a glow discharge to take place between the holding table 27 and the spray plate 30. In such a manner, the shower head 29 operates as an upper electrode. The spray plate 30 has many through-holes 31. The gas delivered to the interior of the shower head 29 is supplied to the surface of the wafer 26 through the through-holes 31.

A baffle plate 32 is disposed between the spray plate 30 of the shower head 29 and the gas delivery pipe 23. The baffle plates 32 has many through-holes 33. As with the first embodiment, each of the through-holes is a two-diameter hole composed of an upper hole portion 34 and a lower hole portion 35. The flow path sectional area (opening area) of the upper hole portion 34 is smaller than that of the lower hole portion 35. The lower hole portion 35 spreads from the upper hole portion 34 with a spread angle in the range from 0.5 to 45 degrees, preferably in the range from 1 to 30 degrees against the center axis of the through-hole 33. The hole diameter at the outlet edge of the lower hole portion 35 is 2½ times or more larger than the hole diameter of the upper hole portion 34, preferably two times or more larger than that thereof.

According to the third embodiment of the present invention, the wafer 26 is placed on the holding table 27. Gas is supplied from the gas supply source 24 to the interior of the shower head 29 through the gas delivery pipe 23. The gas supplied to the interior of the shower head 29 sprays to the surface of the wafer 26 through the through-holes 33 and the through-holes 31. The interior of the processing chamber 22 is set and kept at a predetermined pressure. In this state, the radio frequency power supply 28 applies the radio frequency power to the holding table 27. Thus, the gas sprayed on the wafer 26 becomes radical particles as a plasma. With the radical particles, the etching process is performed for the wafer 26.

As described above, each of the through-holes 33 formed in the baffle plate 32 is a two-diameter hole composed of the upper hole portion 34 (as a first opening portion) and the lower hole portion 35 (as a second opening portion). As with the first embodiment, the upper hole portion 34 causes the flow pressure loss to take place. The lower hole portion 35 causes the flow rate of the gas to decelerate. Thus, the irregularity of flow amounts of through-holes due to the local dynamic pressure of the gas that sprays from the gas outlet 23*a* of the gas delivery pipe 23 decreases. Consequently, the irregularity of the dynamic pressure of the gas that sprays from the edge of each through-hole becomes small. Thus, the gas can be uniformly supplied to the entire surface of the wafer 26.

Next, with a real example, the effect of the third embodiment will be described.

EXAMPLE OF THIRD EMBODIMENT

In the example of the third embodiment, the inner diameter of the gas delivery pipe 23 was 4.8 mm. The number of through-holes 33 was 66. The hole diameter of the upper hole portion 34 was 1 mm. The hole length of the upper hole portion 34 was 1 mm. The hole diameter of the lower hole portion 35 was 3 mm. The hole length of the lower hole portion 35 was 2 mm. The process gas was a mixture of $C_4F_8/Ar/O_2$ (21/510/11=542 sccm). The temperature in the processing chamber 22 was 30° C. The inner pressure of the processing chamber 22 was 40 mTorr. In such conditions, the uniformity of gas flow was obtained by varying the number of through-holes 31 to 300, 800, and 1600, the hole diameter of each of the through-holes 31 to 0.2 mm, 0.5 mm, and 0.8 mm, and the hole length of each of the through-holes 31 to 5 mm, 10 mm, 15 mm and 20 mm. The results are shown in FIG. 6. In addition, using the following comparison examples, the uniformity of gas flow was obtained. In a fifth comparison example, each of the through-holes 33 was a straight hole with a hole diameter of 1 mm. In a sixth comparison example, the baffle plate 32 was not disposed. The results are shown in Table 6.

TABLE 6

| Hole | Number of holes | 300 | | | 800 | | | 1600 | | |
|---|---|---|---|---|---|---|---|---|---|---|
| length | Hole diameter | 0.2 mm | 0.5 mm | 0.8 mm | 0.2 mm | 0.5 mm | 0.8 mm | 0.2 mm | 0.5 mm | 0.8 mm |
| 5 mm | Third embodiment | 0.002 | 0.07 | 0.48 | 0.01 | 0.20 | 1.27 | 0.01 | 0.39 | 2.51 |
| | Fifth comparison example | 0.04 | 1.36 | 7.76 | 0.09 | 3.48 | 16.38 | 0.19 | 6.50 | 24.57 |
| | Sixth comparison example | 0.15 | 5.68 | 28.38 | 0.41 | 13.87 | 51.39 | 0.81 | 24.38 | 67.90 |
| 10 mm | Third embodiment | 0.001 | 0.04 | 0.24 | 0.003 | 0.10 | 0.64 | 0.01 | 0.20 | 1.27 |
| | Fifth comparison example | 0.02 | 0.69 | 4.21 | 0.05 | 1.80 | 9.83 | 0.09 | 3.48 | 16.38 |
| | Sixth comparison example | 0.08 | 2.92 | 16.53 | 0.20 | 7.44 | 34.57 | 0.41 | 13.87 | 51.39 |

As shown in Table 6, as with the first embodiment, it is clear that the value of the uniformity of gas flow remarkably improves. Thus, the present invention can be effectively applied to the etching apparatus 21.

Next, the uniformity of gas flow was obtained in the conditions that the number of through-holes 31 was 800, that the hole length of each through-hole 31 was 10 mm, that the hole diameter of the through-hole 31 was 0.5 mm by varying the hole diameter of the lower hole portion 35 to 1 mm, 1.5 mm, 2 mm, and 2.5 mm. The results are shown in Table 7.

TABLE 7

| Diameter of lower hole | Uniformity (%) |
|---|---|
| 1.0 mm | 1.80 |
| 1.5 mm | 1.00 |
| 2.0 mm | 0.43 |
| 2.5 mm | 0.20 |

As shown in Table 7, when the hole diameter of the lower hole portion 35 is 2½ times of the hole diameter of the upper hole portion 34, the value of the uniformity of gas flow decreases to about ½ times. When the hole diameter of the lower hole portion 35 is two times of the hole diameter of the upper hole portion 34, the value of the uniformity of gas flow decreases to ¼ or less. Thus, when the hole diameter of the lower hole portion 35 is 2½ times or more larger than the hole diameter of the upper hole portion 34, particularly two times or more larger than that thereof, the value of the uniformity of gas flow improves. Thus, it is clear that gas can be uniformly supplied to the entire surface of the wafer 26.

With the etching apparatus 21 according to the third embodiment, the same effect as the first embodiment can be achieved.

(Fourth Embodiment)

Next, with reference to the accompanying drawings, a fourth embodiment according to the present invention will be described.

For simplicity, in the fourth embodiment, similar portions to those in the second embodiment are denoted by similar reference numerals and their description is omitted.

Next, the different points from the second embodiment will be mainly described.

Figure 9:
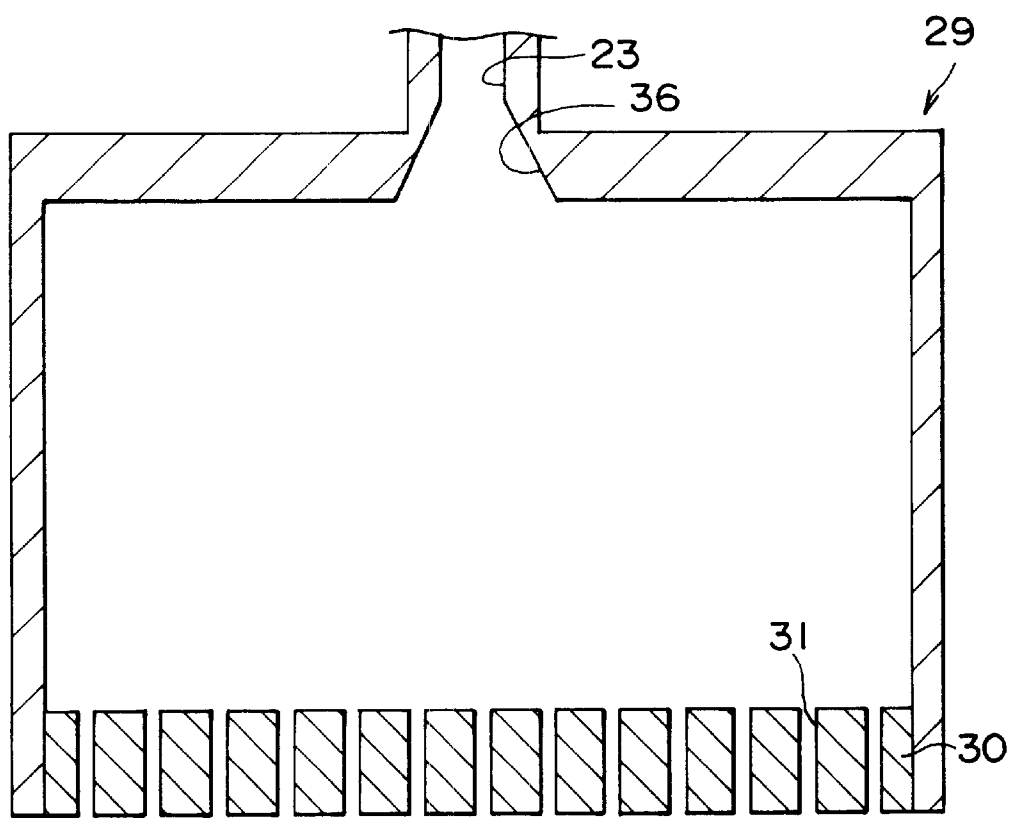
FIG. 9 is a sectional view showing the structure of a shower head according to a fourth embodiment of the present invention.

FIG. 9 is a sectional view showing the structure of a shower head 8 according to the fourth embodiment of the present invention.

As shown in FIG. 9, the fourth embodiment is different from the third embodiment in that the baffle plate 33 is not disposed and that the shape of a gas outlet of a gas delivery pipe 23 of the fourth embodiment is the same as that of the second embodiment.

As with the second embodiment, according to the fourth embodiment, a gas outlet 36 is connected to a processing chamber 22 of the gas delivery pipe 23. The gas outlet 36 spreads toward a shower head 29 with a spread angle in the range from 0.5 to 45 degrees, preferably in the range from 1 to 30 degrees against the center axis of the gas delivery pipe 23. The hole diameter of the gas outlet 36 is 2½ times or more larger than the hole diameter of the gas delivery pipe 23, preferably two times or more larger than that thereof.

As with the second embodiment, according to the fourth embodiment, gas that is delivered from the gas delivery pipe 23 to the gas outlet 36 collides with the wall surface (inner surface) of the gas outlet 36 and thereby decelerates. The gas sprays in a direction of which the flow rate of the gas becomes uniform and thereby the flow rate of the gas that flows in the gas outlet 36 decelerates. Thus, the dynamic pressure of the gas that sprays from the gas outlet 36 can be substantially ignored in comparison with the flow pressure loss in the through-holes 31. The gas uniformly sprays from the through-holes 31. Thus, the gas is uniformly supplied to the entire surface of the wafer 26.

Next, with reference to a real example, the effect of the fourth embodiment will be described.

EXAMPLE OF FOURTH EMBODIMENT

In the example of the fourth embodiment, in the same conditions as the example of the third embodiment, the uniformity of gas flow was obtained by varying the hole length of each of the through-holes 31 to 5 mm and 10 mm and the hole diameter of the gas outlet 36 to 12 mm. The results are shown in Table 8.

TABLE 8

| | (%) | |
|---|---|---|
| | Hole length 5 mm | Hole length 10 mm |
| Fourth embodiment | 0.41 | 0.20 |
| Seventh embodiment | 0.00 | 0.00 |
| Eighth embodiment | 0.07 | 0.03 |

As shown in Tables 6 and 8, it is clear that when the hole diameter of the gas outlet 36 is varied from 4.8 mm to 12 mm, the value of the uniformity of gas flow decreases around 1/30 times.

It is clear that when the gas outlet 36 spreads toward the shower head 29 with a spread angle of 45 degrees or less against the center axis of the gas delivery pipe 23, the same effect as the case that the baffle plate 32 is disposed can be achieved.

According to the fourth embodiment of which the present invention is applied to the etching apparatus 21, the same effect as the second embodiment can be achieved.

The present invention can be applied to the following structures.

Figure 10:
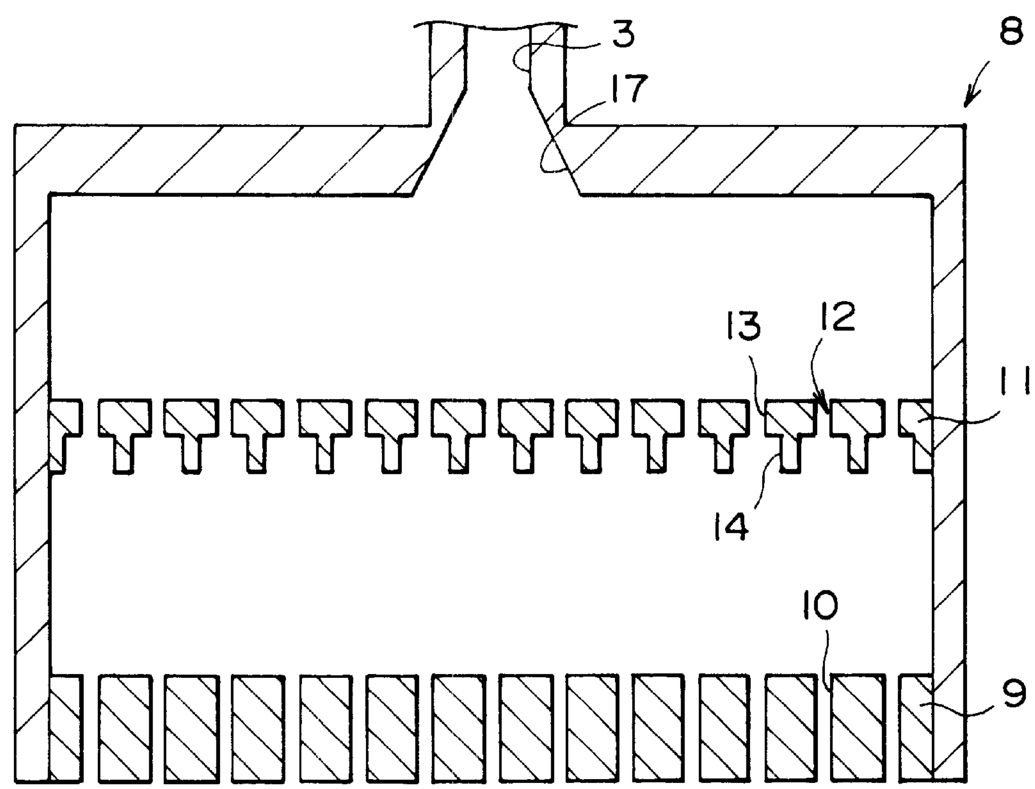
FIG. 10 is a sectional view showing the structure of a shower head according to another embodiment of the present invention.
Figure 11:
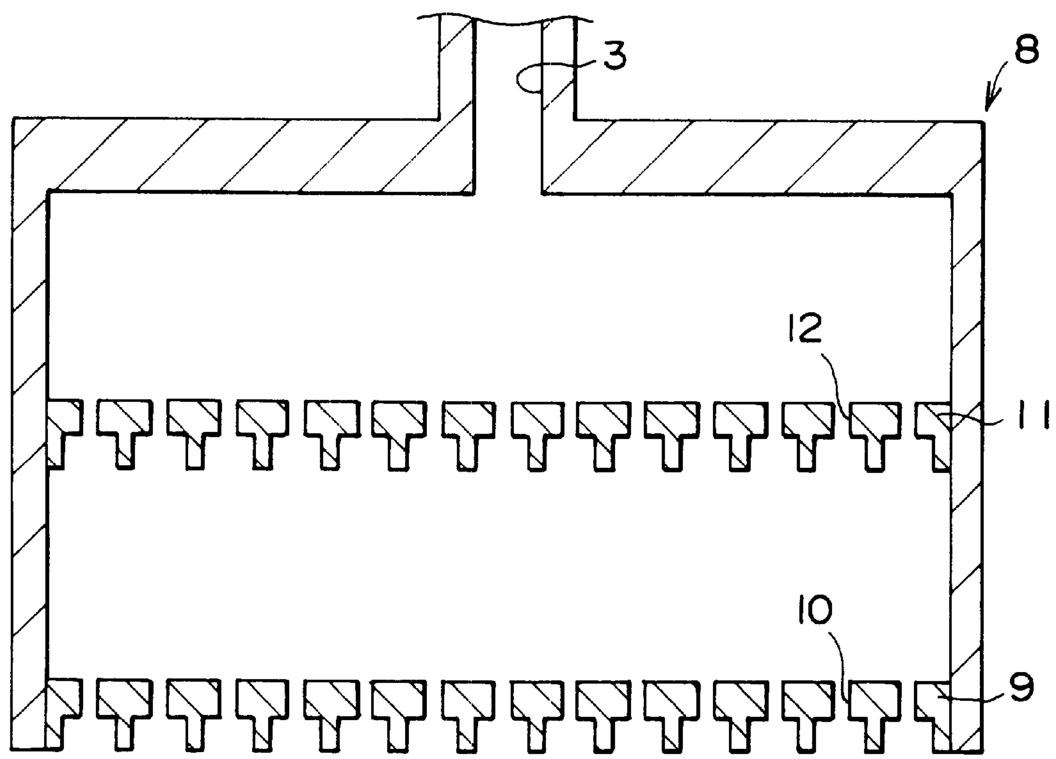
FIG. 11 is a sectional view showing the structure of a shower head according to another embodiment of the present invention.

As shown in FIG. 10, the baffle plate 11 of the first embodiment may be disposed to the gas processing apparatus 1 of the second embodiment. In this example as a fifth example, the uniformity of gas flow was obtained using a baffle plate 11 having an upper hole portion 13 with a hole diameter of 1 mm and a lower hole portion 14 with a hole diameter of 2 mm was disposed by varying the hole diameter of the gas outlet 17 from 7 mm to 20 mm. The results are also shown in Table 5. As a sixth example, the uniformity of gas flow was obtained using a baffle plate 11 having straight holes with a hole diameter of 1 mm. The results are also shown in Table 5. As shown in Table 5, with a baffle plate, the value of the uniformity of gas flow further improves. Particularly, in the fifth example, the uniformity of gas flow remarkably improves. The value of the uniformity of gas flow in the case of the gas outlet 17 having a hole diameter of 15 mm was 0.0076% that was almost the same as the value of the uniformity of gas flow in the case of the baffle plate 11 having through-holes each of which was composed of an upper hole portion with a hole diameter of 0.2 mm and a lower hole portion with a hole diameter of 0.75 mm was disposed (see Table 2). Since the baffle plate 11 of the first embodiment is disposed in the gas processing apparatus 1 of the second embodiment, gas can be more uniformly supplied to the entire surface of the wafer 6. Likewise, the baffle plate 33 of the third embodiment may be disposed in the etching apparatus 21 of the fourth embodiment. As a seventh example, the uniformity was obtained in the case of a baffle plate 33 having an upper hole portion 34 with a hole diameter of 1 mm and a lower hole portion with a hole diameter of 3 mm. The results are shown in Table 8. In addition, as an eighth embodiment, the uniformity was obtained in the case of a baffle plate 33 having straight holes with a hole diameter of 1 mm. The results are also shown in Table 8. As shown in Table 8, with the baffle plate, the uniformity further improves. Particularly, in the seventh example, the value of the uniformity remarkably improves to 0.00. Thus, when the baffle plate 33 of the third embodiment is disposed in the etching apparatus 21 of the second embodiment, the gas can be more uniformly supplied to the entire surface of the wafer 26.

The shape of the gas outlet 17 of the gas delivery pipe 3 is not limited as long as the gas outlet 17 spreads toward the shower head 8 with a spread angle of 45 degrees or less against the center axis of the gas outlet 17. In this case, the gas outlet 17 causes the flow rate of the gas to decelerate and the dynamic pressure of the gas that sprays therefrom to decrease.

According to the present invention, a plurality of gas delivery pipes 3 may be disposed. In addition, the gas delivery pipe 3 may be connected to an upper side portion or a side portion of the shower head 8 rather than the upper center portion thereof. In these cases, the gas flow tends to be irregular due to the dynamic pressure of the gas that sprays from the gas delivery pipe 3. When the gas delivery pipe 3 is connected to a side portion of the shower head, the gas collides with the side wall of the shower head 8 that faces the gas delivery pipe 3. Thereafter, the gas turns in the direction perpendicular to the baffle plate 11 and collides with a peripheral portion of the baffle plate 11. Thus, the backing pressure at the peripheral portion of the baffle plate 11 rises. Consequently, according to the present invention, the gas can be more uniformly supplied to the entire surface of the wafer 6.

In the above-described embodiments, the present invention is applied to the thermal CVD apparatus and the plasma etching apparatus. However, it should be noted that the present invention can be applied to a plasma CVD apparatus and various PVD apparatuses.

The structure of the holding table 7 is not limited as long as it can hold a wafer 6. For example, the holding table 7 may be accomplished by an electrostatic chuck. A clamp that is raised and lowered by a drive mechanism such as an air cylinder may be used so as to press the wafer 6. In addition, the wafer 5 may be placed with gravity.

In the above-described embodiments, the side wall of the shower head 8 is composed of an independent partition wall. However, the present invention is not limited to such a structure. For example, the shower head 8 may be composed of a side wall of the processing chamber 2 and the spray plate 9.

According to the present invention, a plurality of shower heads 8 may be disposed as so-called post-mixing structure. This structure may be used in the case that a plurality of types of gases should be supplied through respective paths so as to prevent the gases from mixing in the shower head 8.

Next, an example of such a post-mix type shower head will be described.

Figure 12:
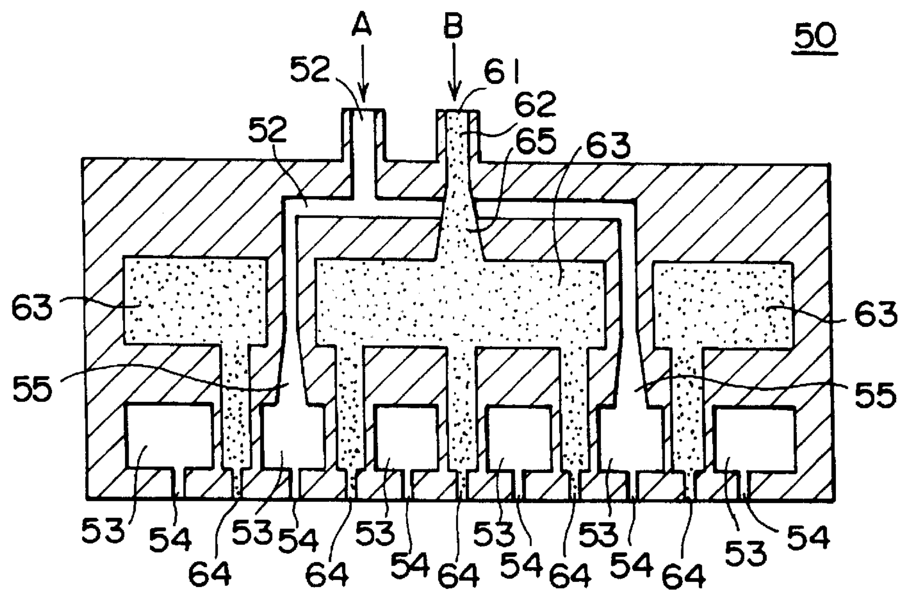
FIG. 12 is a sectional view showing the structure of a gas processing apparatus according to another embodiment of the present invention.
Figure 13:
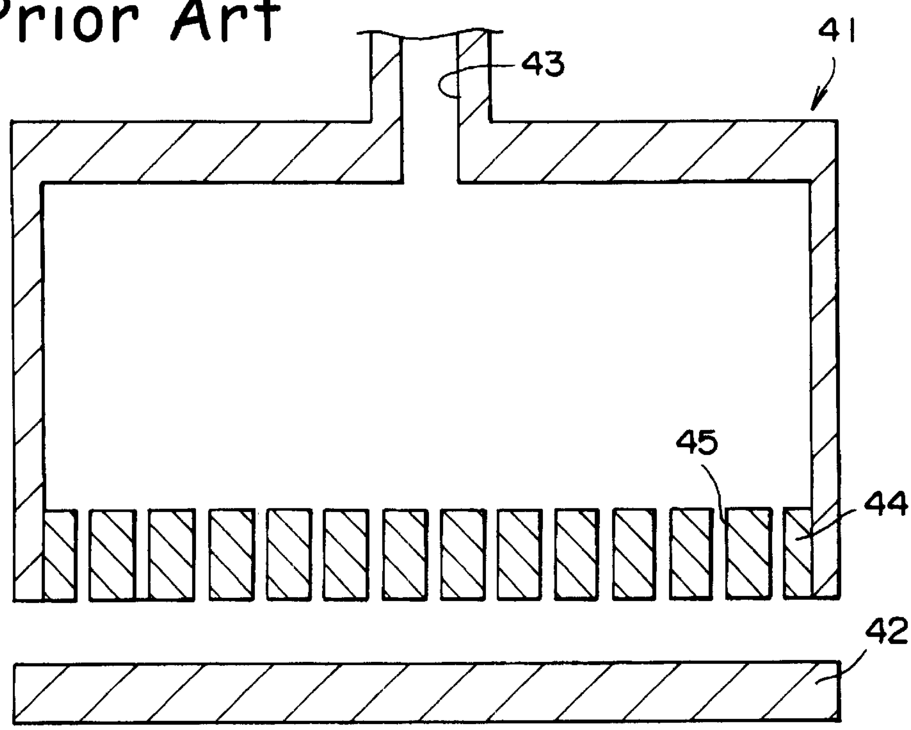
FIG. 13 is a sectional view showing the structure of a conventional shower head that does not have a baffle plate.
Figure 14:
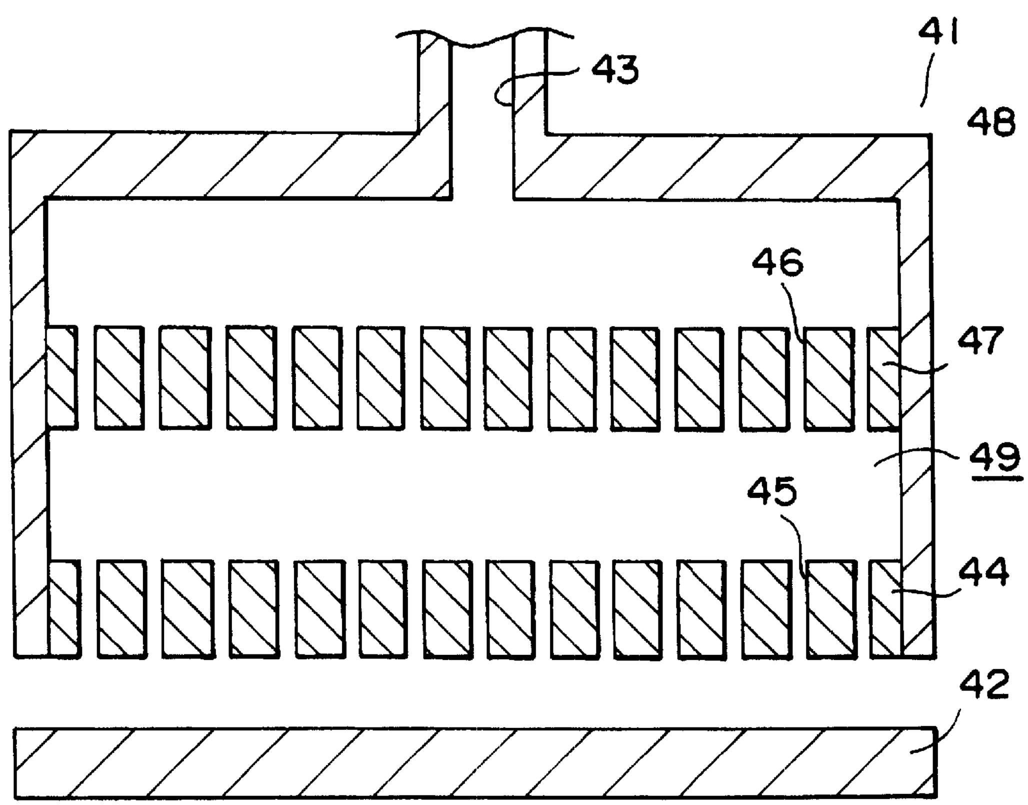
FIG. 14 is a sectional view showing the structure of a conventional shower head that has a baffle plate.

FIG. 12 is a vertical sectional view showing the structure of the post-mix type shower head 50.

As shown in FIG. 12, the shower head 50 has two gas flow paths A and B.

In other words, the gas flow path A is connected to a plurality of small chambers 53 from a gas inlet 51 through a flow path 52. Each of the small chambers 53 has a discharge outlet 54. The small chambers 53 are connected to each other. Process gas delivered from the gas inlet 51 uniformly flows to the small chambers 53 through the flow path 52.

The flow path 52 has spread portions 55 that spread from the upstream side of the process gas flow direction to the downstream side thereof.

Process gas G1 supplied from the gas inlet 51 flows to the small chambers 53 through the flow path 52. When the process gas G1 flows in the spread portions 55, since they spread, the process gas decelerates. The process gas G1 diffuses in the small chambers 53. Thus, until the process gas reaches the discharge outlets 54, the flow rate of the process gas becomes uniform in the horizontal direction of the drawing of FIG. 12. Thus, the flow amounts of the process gas that sprays from the discharge outlets 54 become uniform.

On the other hand, the gas flow path B is connected from a gas inlet 61 to a plurality of small chambers 63 through a flow path 62. The small chambers 63 have respective discharge outlets 64. The small chambers 63 are connected to each other. The process gas supplied from the gas inlet 61 flows to the small chambers 63 through the flow path 62.

The flow path 62 has spread portions 65 that spread from the upstream side in the process gas flow direction to the downstream side thereof.

The process gas G2 supplied from the gas inlet 61 flows to the small chambers 63 through the flow path 62. When the process gas G2 flows in the spread portions 65, since they spread, the process gas G2 decelerates. The process gas G2 diffuses in the small chambers 63. Thus, until the process gas G2 reaches the discharge outlets 64, the flow rate of the process gas G2 becomes uniform in the horizontal direction on the drawing of FIG. 12. Thus, the flow amounts of the process gas that sprays from the discharge outlets 64 become uniform.

As shown in FIG. 12, since the discharge outlets 54 at the edge of the gas flow path A and the discharge outlets 64 at the edge of the gas flow path B are alternately and adjacently disposed, the process gas G1 and the process gas G2 independently and uniformly spray to a wafer (not shown).

As described above, according to the present invention, gas can be uniformly supplied to the entire surface of a workpiece.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A gas processing apparatus, comprising:

a processing chamber that is airtightly structured;

a gas delivery pipe connected to said processing chamber;

a gas supply source for supplying gas to said processing chamber through said gas delivery pipe;

a holding table for holding a workpiece loaded to said processing chamber;

a shower member disposed at a gas outlet of said gas delivery pipe connected to said processing chamber;

a spray plate structured as a partition wall of said shower member that faces said holding table, said spray plate having a plurality of spray holes; and a baffle member disposed between said spray plate in said shower member and the gas outlet and having a plurality of through-holes formed approximately perpendicular to a surface of said baffle member, wherein each of the through-holes of said baffle member communicates with a first opening portion and a second opening portion, the first opening portion being formed on a first surface of said baffle member facing the gas outlet, the second opening portion being formed on a second surface of said baffle member facing said spray plate, the opening area of the second opening portion being larger than the opening area of the first opening portion, wherein said baffle member and said spray plate form a shower pre-chamber therebetween, and wherein a diameter and a length of each through-hole for communicating with the second opening portion are configured such that a dynamic pressure of a gas that sprays from the second opening portion is smaller than a flow pressure loss in the spray hole of said spray plate.

2. The gas processing apparatus as set forth in claim 1, wherein the second opening portion isotropically spreads toward the first opening portion.

3. The gas processing apparatus as set forth in claim 2, wherein the second opening portion spreads toward the first opening portion with a spread angle in the range from 0.5 to 45 degrees against the center axis of the first opening portion.

4. The gas processing apparatus as set forth in claim 1, 2, or 3, wherein the opening area of the second opening portion is two times or more larger than the opening area of the first opening portion.

5. The gas processing apparatus as set forth in claim 4, wherein each of the through-holes is a two-diameter hole composed of a small cylindrical hole portion facing said gas delivery pipe and a large cylindrical hole portion facing said spray plate that are connected on the same axis.

6. The gas processing apparatus as set forth in claim 1, wherein the gas outlet of said gas delivery pipe spreads towards said shower member and the gas outlet and said baffle member form a baffle space therebetween.

7. The gas processing apparatus as set forth in claim 1, wherein the diameter and the length of the through-hole for communicating with the second opening portion are configured such that the dynamic pressure of the gas that sprays from the second opening portion is less than or equal to 0.5 times a flow pressure loss in the spray hole of said spray plate.

8. The gas processing apparatus as set forth in claim 1, wherein the diameter and the length of the through-hole for communicating with the second opening portion are configured such that the dynamic pressure of the gas that sprays from the second opening portion is less than or equal to 0.2 times a flow pressure loss in the spray hole of said spray plate.

9. The gas processing apparatus as set forth in claim 1, wherein the holding table has a size for a wafer with a diameter of 300 mm.

10. The gas processing apparatus as set forth in claim 1, wherein a distance between two adjacent through-holes of the through-holes of said battle member is twice of less smaller than a distance between said baffle member and said spray plate.

11. A gas processing method, using a gas processing apparatus having a processing chamber that is airtightly structured, a gas delivery pipe connected to the processing chamber, a gas supply source for supplying gas to the processing chamber through the gas delivery pipe, a holding table for holding a workpiece loaded to the processing chamber, a shower member disposed at a gas outlet of the gas delivery pipe connected to the processing chamber, a spray plate structured as a partition wall of the shower member that faces the holding table, the spray plate having a plurality of spray holes, and a baffle member disposed between the spray plate in the shower member and the gas outlet and having a plurality of through-holes formed approximately perpendicular to a surface of the baffle member, wherein each of the through-holes of the baffle member communicates with a first opening portion and a second opening portion, the first opening portion being formed on a first surface of the baffle member facing the gas outlet, the second opening portion being formed on a second surface of the baffle member facing the spray plate, the opening area of the second opening portion being larger than the opening area of the first opening portion, wherein the baffle member and the spray plate form a shower pre-chamber therebetween, and wherein a diameter and a length of each through-hole for communicating with the second opening portion are configured such that a dynamic pressure of a gas that sprays from the second opening portion is smaller than a flow pressure loss in the spray hole of said spray plate, the gas processing method comprising:

supplying the gas from the gas supply source to the shower member through the delivery pipe; and spraying the supplied gas to the workpiece through the through-holes and the spray holes, wherein the gas delivered to the first opening portion of each of the through-holes is sprayed to the second opening portion so that the through-holes decelerate a flow speed of the gas.

12. A baffle member for partitioning a space in which gas flows in one direction into a first chamber on the upstream side in the gas flow direction and a second chamber on the downstream side in the gas flow direction, the baffle member having a plurality of through-holes which cause the gas to flow between the first chamber and the second chamber, wherein each of the through-holes of the baffle member communicates with a first opening portion and a second opening portion, the first opening portion being formed on a first surface of the baffle member facing the first chamber, the second opening portion being formed on a second surface of the baffle member facing the second chamber, the opening area of the second opening portion being larger than the opening area of the first opening portion, the through-holes having an axis approximately perpendicular to the first and second surfaces of the baffle member, and wherein a diameter and a length of each through-hole for communicating with the second opening portion are designated in such a manner that a dynamic pressure of a gas that sprays from the second opening portion is smaller than a flow pressure loss in a spray hole of the second chamber.

13. The baffle member as set forth in claim 12, wherein each of the through-holes is a two-diameter hole composed of a small cylindrical hole facing the first chamber side and a tapered hole facing the second chamber side, the small cylindrical hole and the tapered hole being connected on the same axis.

* * * * *